(12) United States Patent
Natarajan et al.

(10) Patent No.: US 8,124,299 B2
(45) Date of Patent: *Feb. 28, 2012

(54) METHODS FOR USING OPTICAL DATA STORAGE MEDIA

(75) Inventors: Arunkumar Natarajan, Schenectady, NY (US); Riffard Pierre Jean-Gilles, Schenectady, NY (US); Kwok Pong Chan, Troy, NY (US); Robert James Perry, Niskayuna, NY (US); Victor Petrovich Ostroverkhov, Ballston Lake, NY (US); Evgenia Mikhailovna Kim, Ballston Lake, NY (US); Julia Lam Lee, Niskayuna, NY (US); Eugene Pauling Boden, Scotia, NY (US); Patrick Joseph McCloskey, Watervliet, NY (US); Brian Lee Lawrence, Waunakee, WI (US)

(73) Assignee: General Electric Company, Niskayuna, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/551,410

(22) Filed: Aug. 31, 2009

(65) Prior Publication Data
US 2011/0053054 A1    Mar. 3, 2011

(51) Int. Cl.
*G03H 1/02* (2006.01)
(52) U.S. Cl. .................................... 430/1; 430/2; 359/3
(58) Field of Classification Search .................. None
See application file for complete search history.

(56) References Cited

U.S. PATENT DOCUMENTS

| 4,879,479 | A | * | 11/1989 | Frazier et al. ............... 359/326 |
| 5,223,356 | A | | 6/1993 | Kumar et al. |
| 6,322,931 | B1 | | 11/2001 | Cumpston et al. |
| 6,402,037 | B1 | | 6/2002 | Prasad et al. |
| 6,432,610 | B1 | | 8/2002 | Rentzepis et al. |
| 6,551,682 | B1 | | 4/2003 | Tosaki et al. |
| 6,947,311 | B2 | | 9/2005 | Berner et al. |
| 6,969,578 | B2 | | 11/2005 | Robello et al. |
| 6,969,764 | B2 | | 11/2005 | Ogiso et al. |
| 7,022,392 | B2 | | 4/2006 | Dinnocenzo et al. |
| 7,355,775 | B2 | * | 4/2008 | Yam et al. ............... 359/241 |
| 7,388,695 | B2 | | 6/2008 | Lawrence et al. |
| 7,452,847 | B2 | | 11/2008 | Kuboyama et al. |
| 7,459,263 | B2 | | 12/2008 | Farid et al. |
| 2004/0245432 | A1 | * | 12/2004 | Takizawa ............... 250/208.1 |
| 2005/0136357 | A1 | | 6/2005 | Farid et al. |
| 2006/0052471 | A1 | * | 3/2006 | Ashman et al. ............... 522/7 |

(Continued)

FOREIGN PATENT DOCUMENTS

EP    1964892    9/2008

(Continued)

OTHER PUBLICATIONS

McKay et al, "Nonlinear luninescence spectroscopy in a Pt:ethenyl compound", J. Appl. Phys, vol. 85(3) pp. 1337-1341 (Feb. 1999).*

(Continued)

*Primary Examiner* — Martin Angebranndt
(74) *Attorney, Agent, or Firm* — Andrew J. Caruso

(57) ABSTRACT

There are provided compositions, optical data storage media and methods of using the optical data storage. The compositions comprise a non-linear sensitizer comprising one or more platinum ethynyl complexes capable of absorbing actinic radiation to cause upper triplet energy transfer to a reactant that undergoes a photochemical change upon triplet excitation.

13 Claims, 7 Drawing Sheets

U.S. PATENT DOCUMENTS

| | | | |
|---|---|---|---|
| 2007/0104978 | A1 | 5/2007 | Che et al. |
| 2008/0144145 | A1 | 6/2008 | Boden et al. |
| 2008/0247011 | A1 | 10/2008 | Lawrence et al. |
| 2011/0081602 | A1* | 4/2011 | Natarajan et al. .............. 430/2 |

FOREIGN PATENT DOCUMENTS

| | | |
|---|---|---|
| WO | 9821521 | 5/1998 |
| WO | WO2006101873 A2 | 9/2006 |

OTHER PUBLICATIONS

Peng et al., "A robust photocatalyst for O2-mediated oxidation of cyclopentadiene based . . . ", Chin, Sci. Bull., vol. 49(13) pp. 1428-1430 (Jul. 2004).*

Noonan et al., "Synthesis, charachterization and photochemistry . . . ", Chapter 11 in Liquid crystalline polymers, Weiss , ed. pp. 144-157 (1990).*

Rogers et al., "Platinum Acetylide two-photon chromophores", Inorg. Chem., vol. 46 (16) pp. 6483-6494) (Jul. 2007).*

Zhan et al., "Transition metal acetylide catalysts for polymerization . . . ", J. Mole. Cat., A., Chem., vol. 184 pp. 139-145 (2002).*

Lee et al., "A photochromic platinum(II) bis(alkynyl) complex containing versatile 5,6-dithienyl-1,10-phenathroline", Organomet., vol. 26(1) pp. 12-15 (Dec. 2006).*

Irie "diarylethenes for memories and switches", Chem. Rev., 100(5) pp. 1685-1716 (Apr. 2000).*

Dini et al., "Nonlinear Optical Effects Related to Saturable and Reverse Absorption by Subphthalocyanines at 532 nm," Chem. Commun., 2005, pp. 3796-3798.

Rogers et al., "Photophysical Characterization of a Series of Platinum(II)-Containing Phenyl-Ethynyl Oligomers", J. Phys. Chem. A., 2002, pp. 10108-10115, vol. 106.

European Search Report dated Nov. 22, 2010 and Written Opinion.

* cited by examiner

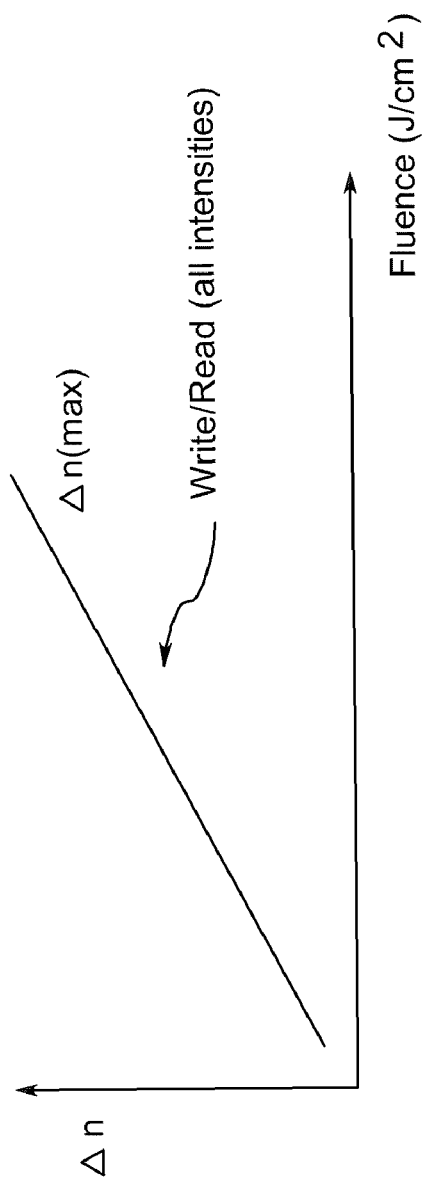
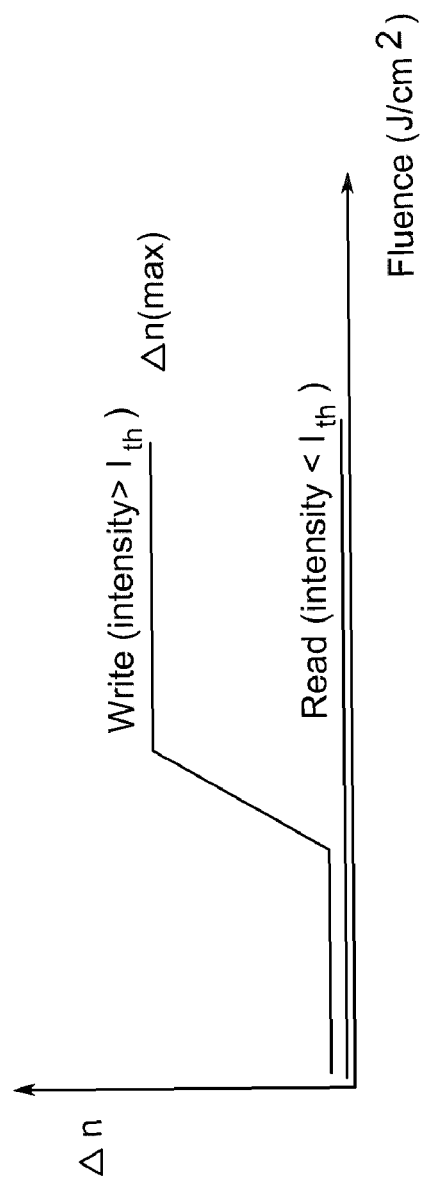
FIG. 1A
FIG. 1B

METHODS FOR USING OPTICAL DATA STORAGE MEDIA

BACKGROUND

The present disclosure relates to compositions and optical data storage media as well as methods of using the optical data storage media.

Generally speaking, reverse saturable absorbers (RSA) are compounds that have extremely low linear absorption at a given wavelength, and transmit nearly all of the light at this wavelength. However, when subjected to high intensity laser power at these given wavelengths, low level linear absorption can lead to a state where the molecule has a higher absorption cross section and becomes highly absorbing at that same wavelength; causing it to strongly absorb subsequent photons. For example, many RSAs experience photoexcitation when impinged upon by incident actinic radiation having a wavelength of 532 nm. Because this wavelength is within the green color portion of the visible spectrum, these RSA's may typically be referred to as "green" RSA's.

Recently, certain RSA's have found utility in the area of data storage systems. Optical data storage, wherein reading or writing of data is accomplished by shining light on, e.g., a disk, provides advantages over data recorded in media which must be read by other means, e.g., a magnetically sensitive head for reading magnetic media, or a needle for reading media recorded in vinyl. And, more data can be stored in smaller media optically than can be stored in vinyl media. Further, since contact is not required to read the data, optical media are not as vulnerable to deterioration over periods of repeated use as vinyl media.

Optical data storage media also offer multiple advantages when compared to magnetic storage media. For example, unlike the magnetic disk drives, optical data storage media are most commonly provided as removable media, readily suitable for archiving and backing up data, sharing of content between unconnected systems, and distribution of prerecorded content. Although removable magnetic media, e.g., magnetic tapes, are available, the life-time of information stored on such media is typically limited to 10-12 years, the media are generally rather expensive, and data access is slow. In contrast, optical data storage media can provide the flexibility of removable recordable and/or prerecorded medium, fast data access time, robust inexpensive manufacturing of the media and drives that are affordable enough for consumer computer and entertainment systems.

Nonetheless, conventional optical data storage media does have limitations. First, the storage density of optical media is limited by physical constraints on the minimum size of a recording bit. Another limitation of optical storage is that data is usually stored in one or two discrete layers, either on the surface or sandwiched within the media. Recording the information depth-wise can increase storage capacity; however, methods of doing so, i.e., bleaching and photoreactions, require a large amount of optical power to produce readable marks. As a result, the rate of recording using these conventional 3D recording methods is slow. Further, the media used in these methods typically exhibits a linear response to light energy, and as a result, may require some mechanism to eliminate the sensitivity of the medium to light after the data have been recorded to eliminate unintended erasure, data loss, etc.

Holographic storage is optical data storage in which the data is represented as holograms, which are images of three dimensional interference patterns created by the intersection of two beams of light in a photosensitive medium. More particularly, the superposition of a reference beam and a signal beam, containing digitally encoded data, forms a 3-D interference pattern within the volume of the medium resulting in a chemical reaction that changes or modulates the refractive index of the photosensitive medium. This modulation records both the intensity and phase information from the signal as the hologram. The hologram can later be retrieved by exposing the storage medium to the reference beam alone, which interacts with the stored holographic data to generate a reconstructed signal beam proportional to the initial signal beam used to store the holographic image.

Early attempts at holographic storage relied on a page-based approach, i.e., where the bits of digital information are encoded into volume holograms as two-dimensional arrays of logical zeros and ones that traversed a 'slice' of the necessarily linear media onto which the holograms were recorded. Because a relatively large volume of the media was utilized, the recording and read-out equipment required to utilize a page-based approach can be complex and expensive, and reading or writing within the media is very sensitive to fluctuations in temperature and vibrations, as well as small variations in writing or reading wavelength or intensity.

As a result of these shortcomings, more recent research into holographic data storage has focused on a bit-wise approach, where each bit (or few bits) of information is represented by a hologram localized to a microscopic volume within a medium to create a region that reflects the readout light. Such localized volume holographic micro-reflectors may be arranged into multiple data layers throughout the volume of the medium. In such an arrangement, the readout and recording of data in the layers inevitably leads to exposure of the adjacent layers to the recording/readout radiation, and so, although linear materials have been shown to work for holographic data storage in single bit application, having a media that can support many layers of data without affecting other layers of data during the writing and reading steps would be more advantageous.

Materials capable of accommodating a bit-wise data storage approach are highly sought after as the equipment utilized to read and write to such material is either currently commercially available, or readily provided with modifications to readily commercially available reading and writing equipment. Further, holographic data storage by the bit-wise approach is more robust to temperature, wavelength, intensity variations, and vibration than holographic data stored using the page-based approach. In order to be optimally useful in the recordation of holograms, and in particular, micro-holograms, bit-wise data storage materials must be non-linear and further, will desirably exhibit refractive index change ($\Delta n$) of at least about 0.005 to about 0.05 in response to recording light. Ultimately, the magnitude of the refractive index modulations produced in the material by the recording light will define the diffraction efficiency for a given system configuration, which translates to the signal to noise ratio, bit error rate, and the achievable data density.

Thus, there remains a need for optical data storage media that can exhibit a nonlinear (or "threshold") response to the recording light intensity and that is suitable for bit-wise holographic data storage. In particular, it would be advantageous for holograms stored in the media to be limited in depth so that increased capacity could be realized. It would be further desirable for such data storage media to be written in such a way that refractive index of the surrounding media is not significantly altered and that a substantial degradation of hologram efficiency at various depths is not seen.

BRIEF DESCRIPTION

A composition is provided, comprising a reactant capable of undergoing a change upon triplet excitation ($T_n$; $n>1$) and a non-linear sensitizer comprising one or more platinum ethynyl complexes capable of absorbing actinic radiation at about 405 nm to cause upper triplet-to-triplet energy transfer to said reactant.

An optical data storage medium is provided. The medium comprises a polymer matrix, a reactant capable of undergoing a change upon triplet excitation ($T_n$; n>1) and a non-linear sensitizer comprising one or more platinum ethynyl complexes capable of absorbing actinic radiation at about 405 nm to cause upper triplet-to-triplet energy transfer to said reactant.

Also provided are methods for optical data storage. The methods comprise providing an optical data storage medium comprising a sensitizer and a reactant. The reactant is capable of undergoing a change upon triplet excitation and the non-linear sensitizer comprises one or more platinum ethynyl complexes and is capable of absorbing actinic radiation to cause upper triplet-to-triplet energy transfer to said reactant.

DRAWINGS

These and other features, aspects, and advantages of the present invention will become better understood when the following detailed description is read with reference to the accompanying drawings in which like characters represent like parts throughout the drawings, wherein:

FIG. 1A is a graphical depiction of the response of a linear sensitizer to actinic radiation;

FIG. 1B is a graphical depiction of the response of a threshold sensitizer to actinic radiation;

DETAILED DESCRIPTION

Figure 2:
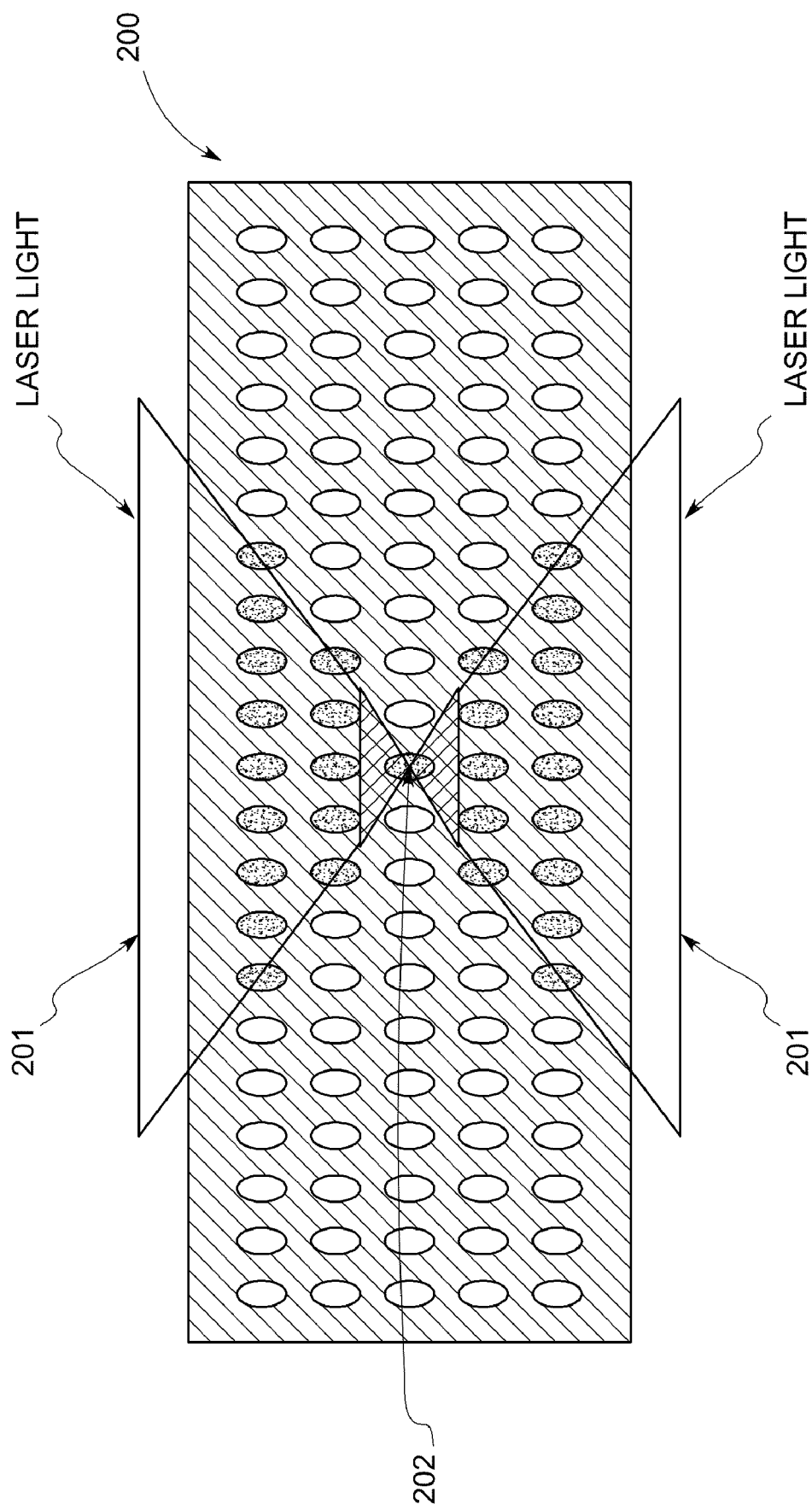
FIG. 2 is a cross-sectional view of an optical storage media, showing the area of impact of actinic radiation if the media comprises a linear sensitizer and the area of impact of actinic radiation if the media comprises a threshold sensitizer.

Unless defined otherwise, technical and scientific terms used herein have the same meaning as is commonly understood by one of skill in the art to which this invention belongs. The terms "first", "second", and the like, as used herein do not denote any order, quantity, or importance, but rather are used to distinguish one element from another. Also, the terms "a" and "an" do not denote a limitation of quantity, but rather denote the presence of at least one of the referenced item, and the terms "front", "back", "bottom", and/or "top", unless otherwise noted, are merely used for convenience of description, and are not limited to any one position or spatial orientation. If ranges are disclosed, the endpoints of all ranges directed to the same component or property are inclusive and independently combinable (e.g., ranges of "up to about 25 wt. %, or, more specifically, about 5 wt. % to about 20 wt. %", is inclusive of the endpoints and all intermediate values of the ranges of "about 5 wt. % to about 25 wt. %", etc.). The modifier "about" used in connection with a quantity is inclusive of the stated value and has the meaning dictated by the context (e.g., includes the degree of error associated with measurement of the particular quantity).

As used herein, "diffraction efficiency" means a fraction of the beam power reflected by a hologram as measured at the hologram location with respect to the incident probe beam power, while "quantum efficiency" means a probability of an absorbed photon to result in a chemical change that produces a refractive index change. "Fluence" means the amount of optical beam energy that has traversed a unit area of the beam cross-section (measured, for example, in Joule/cm$^2$), while "intensity" means optical radiative flux density, e.g. amount of energy traversing a unit area of beam cross-section in unit time (measured in, for example, Watt/cm$^2$).

There is provided herein a composition comprising a reactant and a non-linear sensitizer. More particularly, the composition comprises a reactant capable of undergoing a change upon triplet excitation ($T_n$; n>1) and a non-linear sensitizer comprising one or more platinum ethynyl complexes. The non-linear sensitizers are capable of absorbing incident actinic radiation, e.g., in the form of one or more photons, and then transferring the energy to the reactant molecule by triplet-to-triplet energy transfer to induce a molecular rearrangement of the reactant into a product. The nonlinear sensitizers used in the present optical data storage media are capable of transferring energy from an upper triplet state ($T_n$, wherein n>1), which has a very short lifetime (nanoseconds to a few μ (micro) seconds), to the reactant.

In some embodiments, the present nonlinear sensitizers may absorb two photons, typically, sequentially. Also, once the sensitizers described herein transfer the absorbed energy to the reactant, they return to their original state, and may repeat the process many times over. The sensitizers thus do not get substantially consumed over time, although their ability to absorb energy and release it to one or more reactants may degrade over time. This is in contrast to materials known conventionally as photosensitive materials, which can absorb energy (typically a single photon) and not transfer it to other molecules, but undergo conversion to a new structure, or react with another molecule to form a new compound in so doing.

In one embodiment, the non-linear sensitizers comprise platinum ethynyl complexes which exhibit reverse saturable absorption (RSAs). More particularly, and although many RSAs are known and have been used in nonlinear applications, conventional RSA's typically exhibit absorption spectra and nonlinear optical responses more suited to use with "green" lasers, i.e., lasers utilizing radiation with a wavelength of about 532 nm. In contrast, the present platinum ethynyl complexes are suitable for use with 'blue' lasers, i.e., lasers utilizing radiation with a wavelength of about 405 nm.

The non-linear sensitizer desirably comprises one or more platinum ethynyl complexes, and more particularly, one or more platinum ethynyl complexes capable of transferring energy from an upper excited triplet state (Tn) to adjacent reactants. Platinum ethynyl complexes suitable for use in the optical data storage media include any in which the platinum participates in the delocalization of the π-electron system and/or possess triplet energy levels which connect to singlet state transitions via intersystem crossings. Examples of such complexes include, but are not limited to the following trans-platinum compounds: Bis(tributylphosphine)bis(4-ethynyl-biphenyl)platinum (PPE), and Bis(tributylphosphine)bis(4-ethynyl-1-(2-phenylethynyl)benzene)platinum (PE2), Bis(1-ethynyl-4-(4-n-butylphenylethynyl)benzene)bis(tri-n-butyl)

phosphine)Pt (II). (n-butyl PE2). Bis(1-ethynyl-4-(4-fluorophenylethynyl)benzene)bis(tri-n-butyl)phosphine)Pt (II). (F-PE2), Bis(1-ethynyl-4-(4-methoxyphenylethynyl)benzene)bis(tri-n-butyl)phosphine)Pt (II). (4-MeO-PE2), Bis(1-ethynyl-4-(4-methylphenylethynyl)benzene)bis(tri-n-butyl)phosphine)Pt (II). (Me-PE2), Bis(1-ethynyl-4(3,5-dimethoxyphenylethynyl)benzene)bis(tri-nbutylphosphine)Pt(II) (3,5-diMeO-PE2), Bis(1-ethynyl-4(4-N,N-dimethylaminophenylethynyl)benzene)bis(tri-n-butyl-phosphine)Pt(II)(diMeamino-PE2). In some embodiments, the platinum complex may comprise one or more of PE2 or PPE.

The amount of nonlinear sensitizer used in the composition can depend on its optical density at the wavelength of incident actinic radiation. Solubility of the sensitizer may also be a factor. Generally speaking, the sensitizer may be used in amounts of from about 0.002 weight % to about 5 weight % based upon the total weight of the composition.

Figure 3:
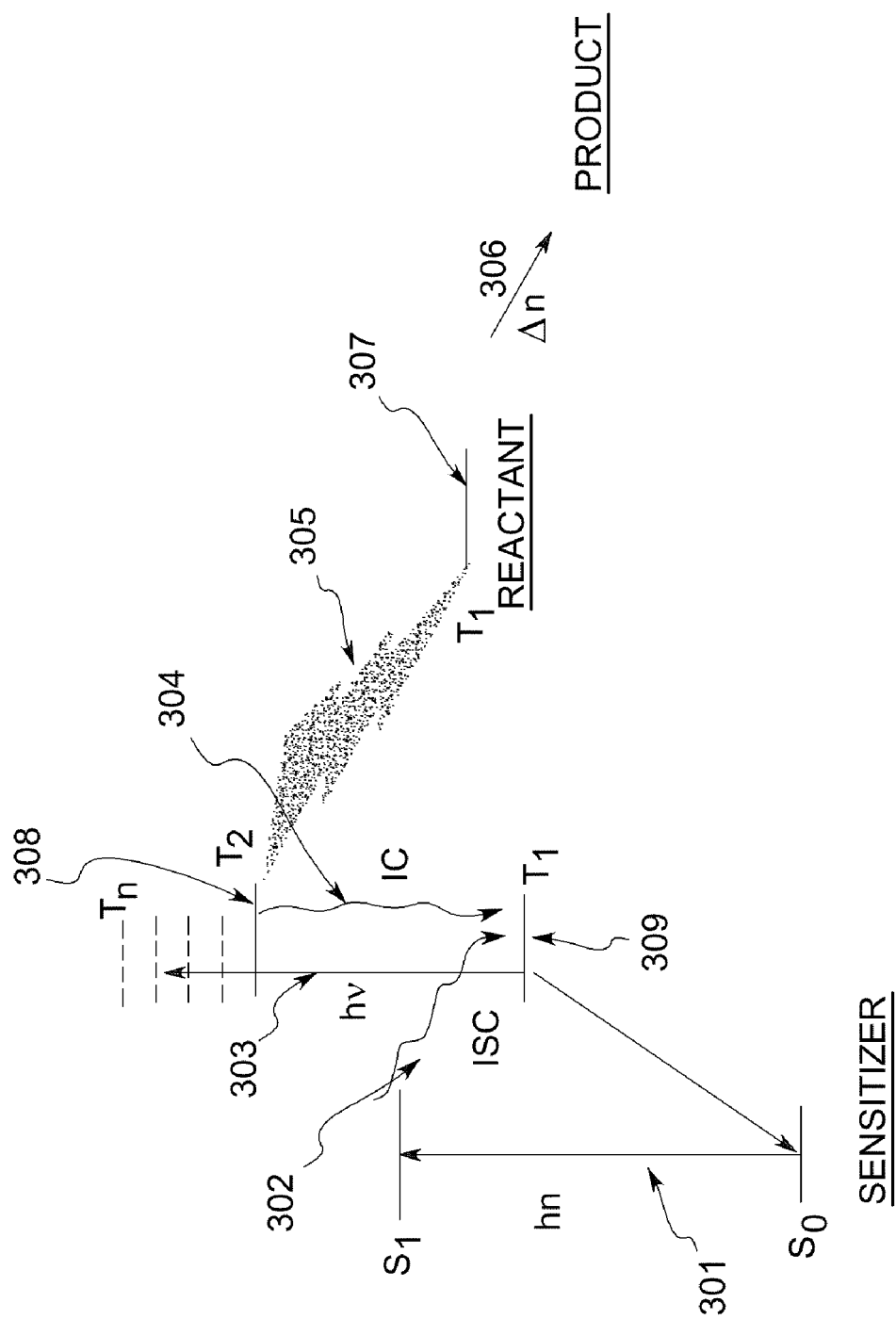
FIG. 3 is a schematic energy level diagram showing the upper triplet $T_n$ excited state absorption and resulting energy transfer for a sensitizer exhibiting reverse saturable absorption.

The reactant(s) utilized in the present composition are capable of undergoing a change upon triplet excitation. Referring to FIG. 3, the reactants used in the present optical data storage media have a triplet energy denoted by arrow 307 below that of the $T_2$ state of the sensitizer denoted by arrow 308, but above that of the $T_1$ state of the sensitizer, shown at arrow 309. The reactants are also capable of receiving energy from an upper triplet state ($T_2$ or higher) of the sensitizer, and undergoing a change to form a product.

As used herein, the term "change" is meant to include any "indirect" photochemical reaction of the reactant, e.g., photodimerization or isomerization. Photodimerization is a bimolecular photochemical process involving an electronically excited unsaturated molecule that undergoes addition with an unexcited molecule of a structurally similar and/or identical species (e.g. two olefins combining to form a cyclobutane ring structure). The covalent bonding that occurs in this reaction produces a new moiety which can be generally classified as a photoproduct. When the word "indirect" is used in conjunction with terms such as photodimerization or photochemical reaction or photoreaction, it means that the reactant did not receive the energy directly from absorption of a photon, but rather from another molecule (such as, e.g., a sensitizer or mediator) that first absorbed the photon and then transferred a portion of that energy to the reactant that subsequently underwent dimerization Examples of reactants suitable for use in some embodiments of the composition described include, but are not limited to, (i) those that can undergo dimerization so that less volume change is required to go from reactant to product, e.g., reactants that undergo dimerization processes not by direct photoexcitation of the reactant but by indirect "non-radiative energy transfer" (in the present case triplet-to-triplet energy transfer) pathway from the photoexcited sensitizer to the reactant; (ii) those for which a nonlinear sensitizer receives energy from a two-photon process and delivers that energy to one reactant that subsequently condenses with a second reactant to provide a product; (iii) those that, when derivatized on a polymer backbone can provide a very large refractive index change, which corresponds to the available capacity of the material, e.g., a $\Delta n_{max}$ of at least about 0.08 can be achieved if >85% of the reactants are converted to product; and (iv) those that, when derivatized on a polymer backbone, are capable of undergoing both inter- and intramolecular condensation reactions, thereby accelerating the consumption thereof, and providing desired refractive index ($\Delta n$) changes with incident fluence of less than 10 J/cm$^2$ as a result of higher quantum efficiency of the sensitized photo-reaction, which in turn may also provide greater diffraction efficiencies and shorter recording times within, e.g., a data storage medium incorporating the composition.

As those of ordinary skill in the art understand, the fundamental requirement for holographic data storage is being able to create a refractive index change (dn) of the individual fringes within the hologram, compared to the surrounding material, on the order of 0.005 to 0.05. However, measuring the refractive index of individual fringes is not possible. Refractive index (RI) measurements can be done on bulk materials using spin coated samples in combination with an instrument knows as an ellipsometer. Thus, the reactive materials used in these applications have first been tested to determine the net available dn the material is capable of by measuring the RI of the unreacted sample and then converting over 85% of the material to the reacted form and remeasuring the RI to determine the dn. The important feature for the hologram in holographic data storage is having a sufficient amount of light reflected back (diffracted) to the detector to represent a bit of information. This can be determined by measuring the diffraction efficiency of the material. Experimentally, it is easiest to use relatively low numerical aperture (NA) lenses and write relatively large holograms to record relatively large diffraction efficiencies. For example, based on the predictions of the coupled wave theory, for a given magnitude of the refractive index modulation, the DE is approximately proportional to the square of the hologram depth. The hologram depth is approximately inversely proportional to NA^2, which makes overall dependence of DE ~1/NA^4. Thus, the D.E. is a function, among other things, of the response of the reactive material, the NA of the lens used, and the fluence used to record the hologram. Since those parameters are often different for experimentalist working on holographic data storage, it is generally recognized that correlating those measurements back to an approximate dn is the preferred method of comparing materials/systems.

Any reactant(s) having a triplet energy state between the $T_1$ and $T_2$ states of the sensitizer can be utilized, and, selection of an appropriate reactant can thus depend upon the selection of the desired sensitizer. Suitable reactants include, but are not limited to, stilbenes. Specific examples of stilbenes expected to be useful in the optical storage media disclosed herein include, but are not limited to trans-stilbene, meta- (or) para halogen (F, Cl, Br, or I) substituted stilbene, meta- (or) para trans-methylstilbene trans-[meta- (or) para]cyanostilbene, trans-[meta- (or) para]-methoxystilbene, [3,3'] or [4,4'], or [2,4] or [3,4]dimethoxy, difluoro, dibromo, dichloro, diiodo, substituted trans-stilbenes, trans-2,4,6-trimethylstilbene, trans-2,2',4,4',6,6'-hexamethylstilbene, or combinations of these.

Even more specifically, suitable reactants include (E)-1-methoxy-4-styrylbenzene, (E)-1-fluoro-4-styrylbenzene, (E)-1-chloro-4-styrylbenzene, (E)-1-bromo-4-styrylbenzene, (E)-1-iodo-4-styrylbenzene, (E)-1-methoxy-3-styrylbenzene, (E)-1-fluoro-3-styrylbenzene, (E)-1-chloro-3-styrylbenzene, (E)-1-bromo-3-styrylbenzene, (E)-1-iodo-3-styrylbenzene, (E)-1-cyano-4-styrylbenzene, or combinations thereof.

Yet other suitable reactants include (E)-1,2-bis(4-methoxyphenyl)ethene, (E)-1,2-bis(4-fluorophenyl)ethene, (E)-1,2-bis(4-chlorophenyl)ethene, (E)-1,2-bis(4-bromophenyl)ethene, (E)-1,2-bis(4-iodophenyl)ethene, (E)-1,2-bis(3-methoxyphenyl)ethene, (E)-1,2-bis(3-fluorophenyl)ethene, (E)-1,2-bis(3-chlorophenyl)ethene, (E)-1,2-bis(3-bromophenyl)ethene, (E)-1,2-bis(3-iodophenyl)ethene, or combinations of these.

Still other suitable reactants include (E)-1-methoxy-2-(4-methoxystyryl)benzene, (E)-1-fluoro-2-(4-fluorostyryl)benzene, (E)-1-chloro-2-(4-chlorostyryl)benzene, (E)-1-bromo-2-(4-bromostyryl)benzene, (E)-1-iodo-2-(4-iodostyryl)benzene, (E)-1-iodo-2-(4-cyanostyryl)benzene, (E)-1-methoxy-3-(4-methoxystyryl)benzene, (E)-1-fluoro-3-(4-fluorostyryl)benzene, (E)-1-chloro-3-(4-chlorostyryl)benzene, (E)-1-bromo-3-(4-bromostyryl)benzene, (E)-1-iodo-3-(4-iodostyryl)benzene, (E)-1-iodo-3-(4-cyanostyryl)benzene, (E)-1-methoxy-2-(3-methoxystyryl)benzene, (E)-1-fluoro-2-(3-fluorostyryl)benzene, (E)-1-chloro-2-(3-chlorostyryl)benzene, (E)-1-bromo-2-(3-bromostyryl)benzene, (E)-1-iodo-2-(3-iodostyryl)benzene, (E)-1-iodo-2-(3-cyanostyryl)benzene, or combinations thereof.

In other embodiments, the reactant(s) may comprise one or more cinnamate materials, cinnamamide and cinnamate derivatives, such as those recently discovered and disclosed in U.S. patent application Ser. No. 12/550,521, attorney docket number 238407-1, entitled "Optical Data Storage Media and Methods of Using the Same", filed concurrently herewith, and incorporated herein by reference in its entirety for any and all purposes, so long as not directly contradictory with the teachings herein. In some embodiments, cinnamate materials that are capable of undergoing [2+2] indirect photodimerization and indirect photopolymerization may be used, due to their transparency (negligible UV absorption) at 405 nm in order to keep the linear bleaching of the cinnamate to a minimum and facilitate only the triplet-triplet energy transfer from the excited sensitizer. In some embodiments, the cinnamate materials will desirably comprise polyvinylcinnamates (PVCm) with cinnamate content of the polyvinyl backbone varying between about 54 wt % to about 75 wt % based upon the total weight of the polyvinylcinnamate.

Examples of polyvinylcinnamates and cinnamamide analogs include, but are not limited to, polyvinylcinnamate (PVCm), polyvinyl 4-chlorocinnamate (PVClCm), polyvinyl 4-methoxycinnamate (PVMeOCm), (2E,2'E)-((1S,2S)-cyclohexane-1,2-diyl)bis(3-phenylacrylate), (2E,2'E)-(1S,2S)-cyclohexane-1,2-diyl)bis(4-chlorophenylacrylate), (2E,2'E)-(1S,2S)-cyclohexane-1,2-diyl)bis(4-methoxyphenyl)acrylate). (2E,2'E)-N,N'-((1S,2S)-cyclohexane-1,2-diyl)bis(3-phenyl)acrylamide(2E,2'E)-N,N'-((1S,2S)-cyclohexane-1,2-diyl)bis(3-(4-chlorophenyl)acrylamide), (2E,2'E)-N,N'-((1S,2S)-cyclohexane-1,2-diaryl)bis(3-(4-methoxyphenyl)acrylamide. These are shown below:

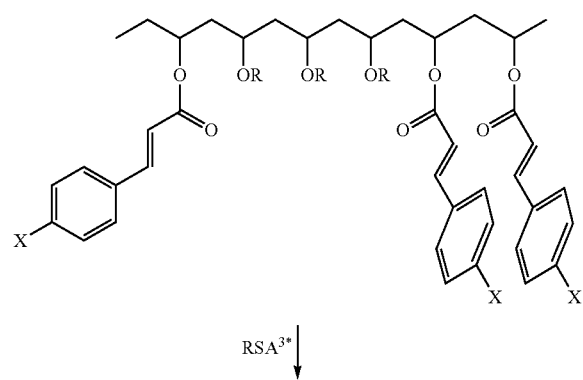

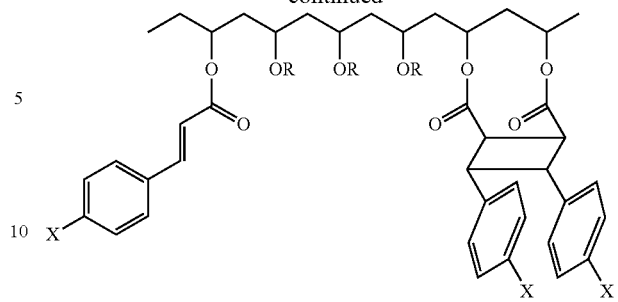

Where R=H or Cinnamate
X=H (Polyvinylcinnamate (PVCm),
OMe (Polyvinyl 4-methoxycinnamate (PVMeOCm), or
Cl (Polyvinyl 4-chlorocinnamate (PVClCm)

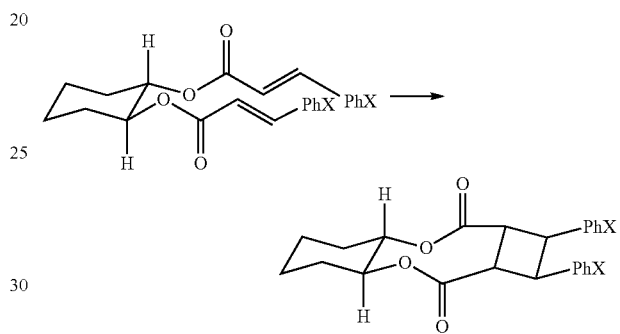

Where X=(para)-H: (2E,2'E)-((1S,2S)-cyclohexane-1,2-diyl)bis(3-phenylacrylate) or
X=(para)-Cl: (2E,2'E)-((1S,2S)-cyclohexane-1,2-diyl)bis(3-(4-chlorophenyl)acrylate)
or X=(para)-MeO: (2E,2'E)-((1S,2S)-cyclohexane-1,2-diyl)bis(3-(4-methoxyphenyl)acrylate)

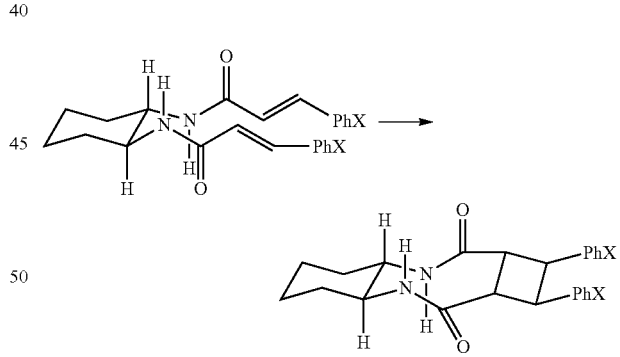

Where X=(para)-H: (2E,2'E)-N,N-((1S,2S)-cyclohexane-1,2-diyl)bis(3-phenyl)acrylamide) or
X=(para)-Cl: (2E,2'E)-N,N'-((1S,2S)-cyclohexane-1,2-diyl)bis(3-(4-chlorophenyl)acrylamide) or
X=(para)-MeO: (2E,2'E)-N,N'-((1S,2S)-cyclohexane-1,2-diyl)bis(3-(4-methoxyphenyl)acrylamide).

The reactant is usually present in relatively high concentrations to promote more efficient triplet energy transfer. For example, the reactant may be present in the composition in amounts of from about 2 weight % to about 80 weight %, based upon the total weight of the composition.

Optionally, the composition may further comprise a mediator to assist in upper triplet energy transfer from the sensitizer to the reactant. The triplet state ($T_{1m}$) of the mediator will desirably be (a) below the triplet state ($T_n$; n>1) of the sensitizer but above the $T_1$ of the sensitizer and (b) above the triplet state ($T_{1r}$) of the reactant, or ideally between about 50 kcal/mol and 90 kcal/mol.

Examples of suitable mediators include, but are not limited to, acetophenone ($T_1 \approx 78$ kcal/mol), dimethylphthalate ($T_1 \approx 73$ kcal/mol), propiophenone ($T_1 \approx 72.8$ kcal/mol), isobutyrophenone ($T_1 \approx 71.9$ kcal/mol), cyclopropylphenylketone ($T_1 \approx 71.7$ kcal/mol), deoxybenzoin ($T_1 \approx 71.7$ kcal/mol), carbazole ($T_1 \approx 69.76$ kcal/mol), diphenyleneoxide ($T_1 \approx 69.76$ kcal/mol), dibenzothiophene ($T_1 \approx 69.5$ kcal/mol), 2-dibenzoylbenzene ($T_1 \approx 68.57$ kcal/mol), benzophenone ($T_1 \approx 68$ kcal/mol), polyvinylbenzophenone ($T_1 \approx 68$ kcal/mol), 1,4-diacetylbenzene ($T_1 \approx 67.38$ kcal/mol), 9H-fluorene ($T_1 \approx 67$ kcal/mol), triacetylbenzene ($T_1 \approx 65.7$ kcal/mol), thioxanthone ($T_1 \approx 65.2$ kcal/mol), biphenyl ($T_1 \approx 65$ kcal/mol), phenanthrene ($T_1 \approx 62$ kcal/mol), phenanthrene ($T_1 \approx 61.9$ kcal/mol), flavone ($T_1 \approx 61.9$ kcal/mol), 1-napthonitrile ($T_1 \approx 57.2$ kcal/mol), poly(β-naphthoylstyrene) ($T_1 \approx 55.7$ kcal/mol), Fluorenone ($T_1 \approx 55$ kcal/mol), and combinations of these The amount of mediator used, if any, should not be so much as to cause self-quenching, i.e., when two triplets of the mediator meet each other to generate a singlet state and a ground state of the mediator. Optimal amounts of any mediator may also depend on the particular sensitizer. Bearing such considerations in mind, useful concentrations of the mediator can range from about 1 weight % to about 20 weight % based upon the total weight of the composition.

The compositions provided may be utilized in any application in which their properties may provide benefit. Examples of these include, but are not limited to, optical waveguides, gradient index lenses, optical data storage media and in digital holographic imaging.

Optical waveguides are used as components in integrated optical circuits and can be made in various ways. One way is to use a laser to pattern a photosensitive material creating a "core" of one refractive index material surrounded by a "cladding" material of a different refractive index that serves to guide the light. Generally, these photosensitive materials are linearly responsive; requiring the wavelength of the patterning laser and the absorption of material that undergoes refractive index change to both be at wavelengths well away from the wavelengths of light that will actually travel within the waveguide. This is necessary because if the waveguided beam is the same or nearly the same as the light traveling in the core, then it will begin to bleach the cladding material and broaden the waveguide; making it degrade and become unusable. However, with these materials, the medium will only change at the highest intensity area of the beam during patterning, and together with the threshold effect, could produce sharper contrast between the core and cladding regions. Also, light of a similar wavelength at lower intensity could travel down the core and would not degrade the cladding material. Optical waveguides could thus be improved via incorporation of the compositions described herein.

Gradient-index (GRIN) lenses could also be fashioned from the compositions described herein. A GRIN lens is a lens whose material refractive index varies continuously as a function of spatial coordinates in the medium. With the present compositions, a composition could be converted into a GRIN lens by patterning with a laser operating at high power. Alternatively, a blank lens with a composition could be modified into a GRIN lens in a similar manner. The advantages are that the lens could be used with low power light beams at various wavelengths without the danger of bleaching away the GRIN and destroying the lens.

Digitial Holographic Imaging is a way to create 3D images useful for visualizing without the aid of special glasses (autostereoscopic). These are useful for producing interactive 3D displays for government and commercial uses such as cities with skyscrapers that can be viewed from various angles. Again, use of the compositions described, with threshold characteristics, allows the proper patterning without the problem of bleaching in ambient light.

There is also provided herein an optical data storage medium that, in addition to the nonlinear sensitizer, reactant, and optionally mediator, further comprises a polymer matrix. The optical data storage medium desirably exhibits a nonlinear response to actinic radiation, i.e., experiences no substantial change in refractive index for incident laser light below a threshold, and significant changes in refractive index above the threshold. Advantageously, while recording into such a medium is only possible with the light having a power, or intensity, exceeding a threshold value, the recorded data can be repeatedly and substantially non-destructively read with light having an intensity below the threshold. Microholograms recorded in the present optical data storage media are expected to be smaller in size than the beam used to record them. Finally, the media comprises a sensitizer that is capable of absorbing actinic radiation at about 405 nm to cause upper triplet-to-triplet energy transfer to said reactant, so that storage capacity of the media is optimized, while the media is yet compatible with current conventional storage formats, e.g., Blu-ray.

The optical data storage media comprises a non-linear sensitizer and a reactant dispersed within a polymer matrix. The non-linear sensitizers are capable of absorbing incident actinic radiation, e.g., in the form of one or more photons, and then transferring the energy to the reactant molecule to induce a molecular rearrangement of the reactant into a product that, in turn, gives rise to modulations in the refractive index of the medium. This modulation records both the intensity and phase information from the incident actinic radiation as the hologram. The advantages of the use of nonlinear (or "threshold") sensitizers as opposed to linear sensitizers can be further understood with references to FIGS. 1A, 1B, and 2.

More specifically, FIG. 1A shows the response of a linear photosensitive material to incident actinic radiation, while FIG. 1B shows the response of a threshold material to incident actinic radiation. As is shown in FIG. 1A, linear photosensitive materials will cause a reaction at any power density (intensity) of recording light and the amount of the refractive index change (Δn) achieved will be the same for the same radiative energy (fluence) received by the material. In contrast, threshold materials will only cause a reaction at and over a certain light intensity of recording light.

As a result, and as is shown in FIG. 2, in optical data storage media 200 comprising linear photosensitive materials, consumption of dynamic range will occur in non-addressed volumes, substantially everywhere actinic radiation passes through, shown as sections 201. In contrast, if optical data storage media 200 comprises threshold materials, consumption of dynamic range in non-addressed volumes is reduced or eliminated and consumption will occur substantially only in the target volume, i.e., at the focal point 202 of the actinic radiation. The use of threshold materials in the present optical data storage medium thus facilitates recording into a layer of bit-wise data buried in the bulk of the medium without disruption of adjacent layers of previously recorded data or vacant space available for subsequent recording. Also, as the light intensity in a tightly focused laser beam varies dramatically through the depth of the focal spot and is usually at its maximum at the beam waist (narrowest cross section), the threshold response of the medium will naturally restrict material conversion to occur only in the immediate vicinity of the beam waist. This may lead to a reduction in microhologram size within each layer, thus facilitating an increase in layer data storage capacity of the present media, so that the overall data storage capacity of the media may also be increased. The optical data storage media comprising the threshold materials will also advantageously be substantially stable in ambient light, so that exposure to the same does not result in substantial deterioration or damage to the media.

As mentioned above, the nonlinear sensitizers used in the present compositions and optical data storage media are capable of transferring energy from an upper triplet state ($T_n$, wherein n>1), which has a very short lifetime (nanoseconds to a few μ (micro) seconds), to the reactant. The ability to transfer energy from the $T_n$ state provides the optical data storage media provided herein with its nonlinear, threshold properties. That is, $T_n$ excited state absorption is only appreciable when the sensitizer is excited by high-intensity light, e.g., light having an intensity at least 2 orders of magnitude or greater than ambient light, and negligibly small when subjected to low-energy radiation. This allows for the present optical data storage media, comprising the nonlinear sensitizers, to remain substantially transparent and inert to low intensity radiation, e.g., reading or ambient light, and to only change its properties (absorbance and thus, refractive index) in response to high energy recording light at or near the focal points. As a result, the present optical data storage media exhibits the threshold behavior desired and/or necessary for the bit-wise recordation of microholographic data.

FIG. 3 is a schematic energy level diagram showing the upper triplet $T_n$ excited state absorption and resulting energy transfer for a sensitizer exhibiting reverse saturable absorption. As shown in energy level diagram 300, arrow 301 illustrates the ground state absorption cross section of a photon as it transitions from the singlet ground state $S_0$ to a first excited state $S_1$. The intersystem-crossing rate, represented by arrow 302, signifies the transfer of energy that occurs when the sensitizer moves from an excited singlet state $S_1$ to a corresponding triplet state $T_1$. Arrow 303 indicates the excited triplet state absorption cross section. Once the upper level triplet state $T_n$ is achieved by subsequent linear absorption, two upper excited decay processes are possible. One possible decay process, denoted by arrow 304 in FIG. 3, is the non-radiative relaxation by internal conversion (IC) to the lower lying $T_1$ state. The other possible decay process is denoted by arrow 305 in FIG. 3, and involves the release of energy from the sensitizer and the transfer of this energy to the reactant via triplet-triplet energy transfer. The reactant then undergoes a change denoted by arrow 306 to form the holographic grating and record the data there.

The amount of nonlinear sensitizer used in the optical data storage media can depend on its optical density at the wavelength of light used to record the hologram. Solubility of the sensitizer may also be a factor. Generally speaking, the sensitizer may be used in an amount of from about 0.002 weight % to about 5 weight % based upon the total weight of the optical data storage media.

In some embodiments, the optical data storage media is expected to exhibit refractive index changes (Δn) suitable for the recordation of microholograms at high data densities, e.g., refractive index changes of at least about 0.005, or at least about 0.05, or even greater. Because of the refractive index change/diffraction efficiencies achievable by the present optical data storage media, the media may be capable of storing about 1 TB of information on a disk comparable in size to a single CD or single DVD.

Also, the use of the reactants disclosed herein provides a significant decrease in birefringence as compared to conventional reactants. Finally, the optical recording media described provides the ability to rapidly create high-resolution micro-holograms with minimal heat formation and signal leakage to neighboring locations that can result in smearing of the captured holographic pattern.

The reactant is usually present in relatively high concentrations both to yield large changes in optical properties within the polymer matrix and to promote more efficient triplet energy transfer. For example, the reactant may be present in the optical data storage media in amounts of from about 2 weight % to about 80 weight %, based upon the total weight of the optical data storage media.

The reactant(s) may provide the possibility of a higher loading in the optical data storage media when derivatized on a polymer backbone than conventional reactants. That is, whereas loading of conventional reactants when derivatized on a polymer backbone may be limited to no more than about 30 wt %, the novel reactants described here can be loaded onto polymer backbones at much greater loadings, i.e., even up to about 90 wt %, based upon the total weight of the optical data storage media.

The reactant may be covalently attached, or otherwise associated with, the polymer matrix of the optical data storage media. For example, polymers functionalized with cinnamates may be utilized as the polymer matrix, and e.g., polyvinyl cinnamates are readily commercially available. In this case, the optical data storage media may comprise higher loading amounts of the reactants, e.g., up to about 90 weight %, based upon the total weight of the optical data storage media.

If utilized, any desired mediator may be covalently attached to, or otherwise associated with, the polymer matrix. Incorporating the mediator into the polymer matrix in this way can allow for higher concentrations of the mediator to be utilized, which, in turn, can increase recording efficiency of the data storage media.

The desired sensitizer and reactant, and optional mediator, may be substantially uniformly dispersed through a polymer matrix, or may be dispersed in any fashion so that bit-wise data recordation is facilitated within the optical data storage medium. The polymer matrix may comprise a linear, branched or cross-linked polymer or co-polymer. Any polymer may be used so long as the sensitizer and reactant can be substantially uniformly dispersed therein. Further, any polymer utilized will desirably not substantially interfere with the upper triplet energy transfer process. The polymer matrix may desirably comprise a polymer that is optically transparent, or at least has a high transparency at the wavelength contemplated for recording and reading the optical data storage medium.

Particular examples of suitable polymers for use in the polymer matrix include, but are not limited to, poly(alkyl methacrylates), such as poly(methyl methacrylate) (PMMA), polyvinyl alcohols, poly(alkyl acrylates), polystyrenes, polycarbonates, poly acrylates, poly(vinylidene chloride), poly (vinyl acetate), and the like.

The polymer matrix may also contain a plasticizer, such as dibutyl phthalate, dibutyl sebacate or di(2-ethylbexy) adipate. Plasticizers can enhance recording efficiencies by facilitating molecular motion. Typical plasticizer levels can range from about 1 weight % to about 20 weight %, based upon the total weight of the storage media, or from about 2 weight % to about 10 weight %.

The optical data storage media described herein may be in a self-supporting form. Or, the data storage media may be coated onto a support material, such as polymethyl(methacrylate) (PMMA), polycarbonate, poly(ethylene terephthalate), poly(ethylene naphthalate), polystyrene, or cellulose acetate Inorganic support materials such as glass, quartz or silicon may also be used, in those embodiments wherein use of a support material may be desired.

In such embodiments, the surface of the support material may be treated in order to improve the adhesion of the optical data storage media to the support. For example, the surface of the support material may be treated by corona discharge prior to applying the optical data storage media. Alternatively, an undercoating, such as a halogenated phenol or partially hydrolyzed vinyl chloride-vinyl acetate copolymer can be applied to the support material to increase the adhesion of the storage media thereto.

Generally speaking, the optical data storage media described herein can be prepared by blending the desired sensitizer, reactant, mediator (if desired) and polymer matrix. Proportions of these may vary over a wide range, and the optimum proportions and methods of blending may be readily determined by those of ordinary skill in the art. For example, the sensitizer may be present in concentrations of from about 0.01 weight % to about 90 weight %, and the reactant may be present in concentrations of from about 2 weight % to about 80 weight %, or even up to about 90 weight %, based upon the total weight of the optical data storage media.

EXAMPLE 1

Synthesis of Platinum-Ethynyl Complexes

Starting Chemicals: Potassium tetrachloroplatinate, tri-n-butylphosphine, CuI, phenylacetylene, 4-iodo-(trimethylsilylethynyl)benzene, dichlorobis(triphenylphosphine) palladium(II), diethylamine, 4-ethynyl biphenyl, 4-ethynyl-1-anisole were purchased (all from Aldrich) were used as received.

Cis-PtCl$_2$(PBu$_3$)$_2$ (3). Potassium tetrachloroplatinate (5.063 g, 12.197 mmol) and water (60 g, 3.33 mol) were added to a 250-mL, 3-neck round bottom flask. A solution of tri-n-butylphosphine (5.148 g, 25.44 mmol) dissolved in 100 mL of dichloromethane (134.1 g, 1.56 mol) was poured into the aqueous solution. Two phases formed and after 5 minutes, the organic layer developed a light salmon pink color as the product is formed. The mixture was vigorously stirred overnight with an overhead stirrer. The salmon-pink organic layer was collected using a separatory funnel and the aqueous layer further extracted with dichloromethane. The combined organic samples were concentrated, giving 8.061 g, (99%) product as a light yellow solid as a mixture of cis and trans isomers: $^1$H NMR (C$_6$D$_6$) δ: 2.01 (m, 12H), 1.72 (m, 12H), 1.49 (m, 12H), 1.02-0.91 (m, 18H). $^{13}$C{$^1$H} NMR (C$_6$D$_6$) 26.03, 24.37, 20.67, 13.76. $^{31}$P (CDCl$_3$) 2.06-cis.

Depending on the time of reaction and workup procedure, all cis or a mixture of cis and trans isomers were obtained and could be the ratio determined using $^{31}$P and/or $^{195}$Pt NMR spectroscopy. Thermal isomerization of cis→trans was reported to occur above its melting point (144° C.).[6] However, it was found during subsequent experiments that coupling reactions of 3 or 4 with terminal acetylenes produced the thermodynamically more stable trans compound from any cis isomer in the starting material.

Figure 4:
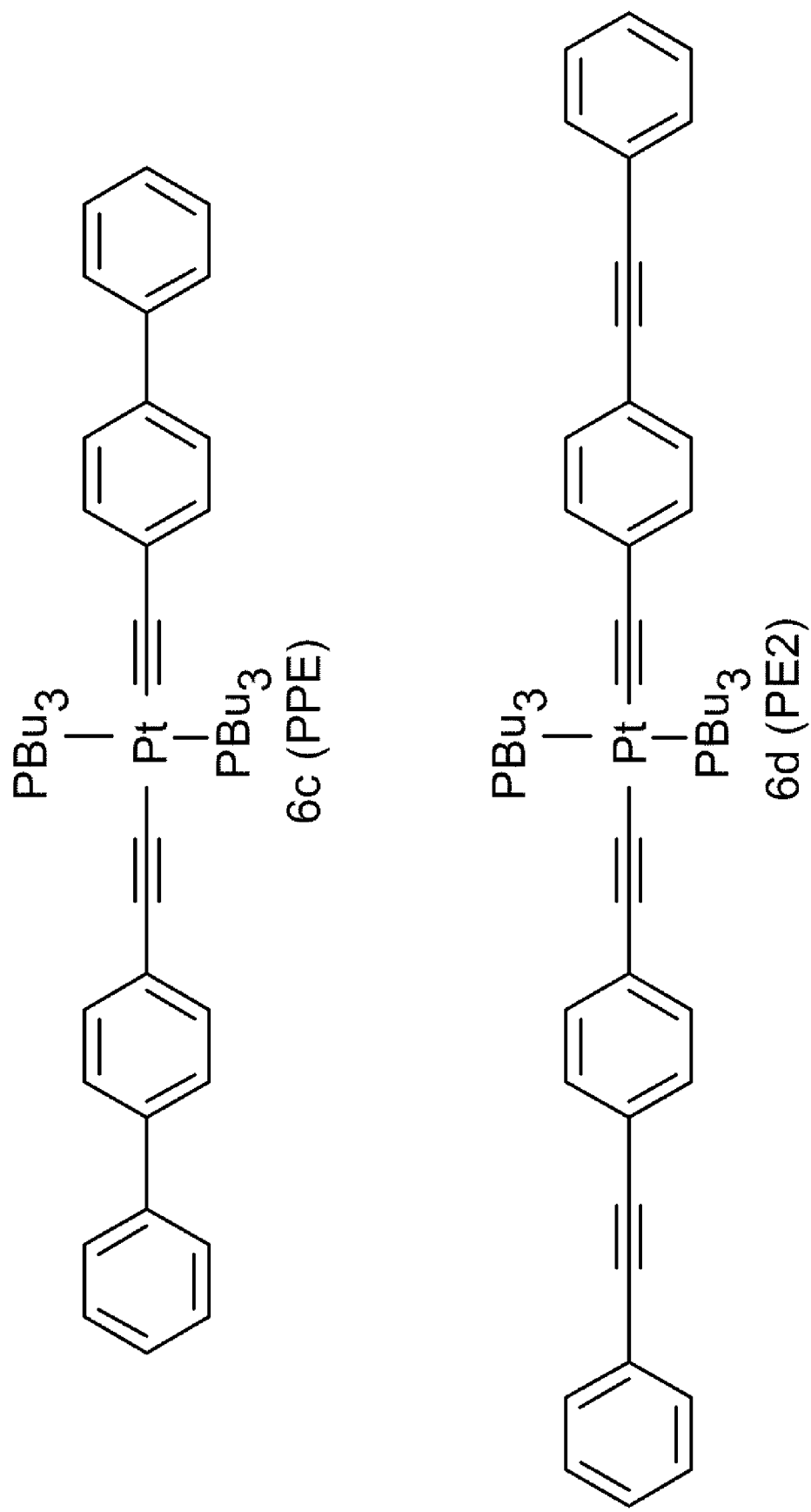
FIG. 4 shows the chemical formulae of certain platinum-ethynyl complexes (PPE and PE2) useful in the media and methods described herein.

FIG. 4 shows the base structure for the two classes of Platinum compounds prepared for evaluation. Each of these specific molecules listed below also had an acronym used as an identifier. These are shown below the structures and have been commonly used in the literature. The naming protocol for 6c is for a pair of PhenylPhenylEthynyl (PPE) groups and PE2 is from pairs of two-PhenylEthynyl moieties.

Figure 5:
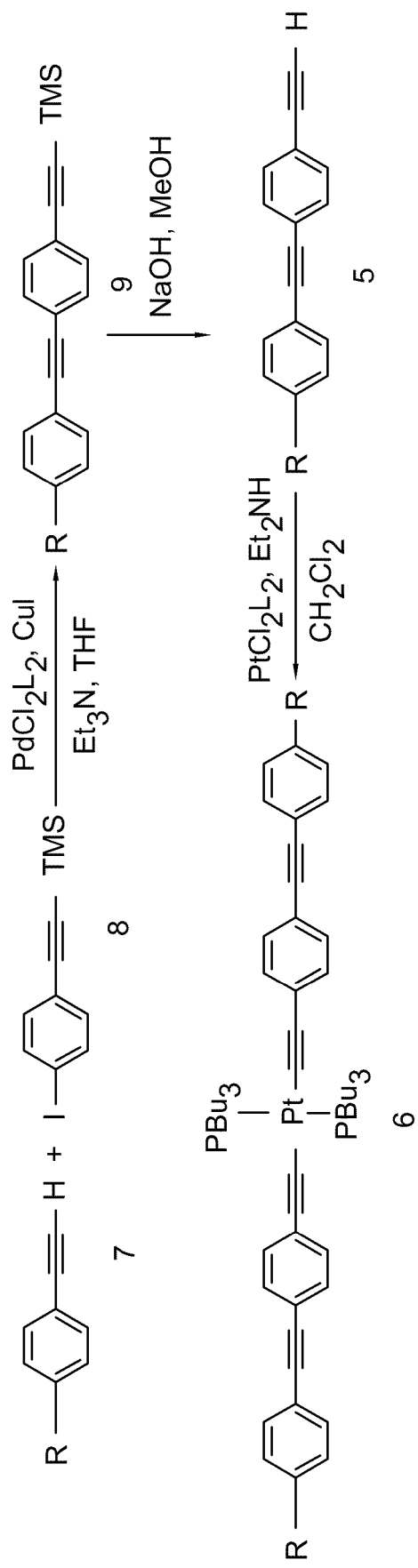
FIG. 5 is a flowchart of the synthesis of a platinum-ethynyl complex (PE2) useful in the present media and methods.

In addition to the basic PE2 compound, a series of substituted PE2's were prepared. The overall 3-step process is shown in FIG. 5. Experimental is provided for compounds prepared having the following R groups in the para-position: Hydrogen (PE2), Flourine (F-PE2), n-butyl (n-Bu-PE2), methoxy (MeO-PE2), methyl (Me-PE2), and dimethylamino (DMA-PE2). Additionally, not depicted in the Figure is a 3,5-dimethoxy analog. The synthesis proceeded as follows. Dehydrohalogenation and C—C bond formation between 7 and 8 readily gave dialkyne 9 in good yields. Deprotection of the silyl group was followed by Palladium catalyzed reaction to give the desired platinum compounds (6).

Bis(1-ethynyl-4-(4-biphenylethynyl)benzene)bis(tri-n-butyl)phosphine)Pt (II) (PPE) (6c). trans-dichlorobis(tri-n-butylphosphine) platinum (II) (1.761 g, 2.626 mmol) was added to a 3-neck, round bottom flask (100 mL), followed by CuI (0.005 g, 0.026 mmol), 4-ethynyl biphenyl (1.001 g, 5.616 mmol) and diethylamine (65 mL, 592 mmol). The yellow solution was stirred overnight under N$_2$. The solvent was evaporated leaving behind a yellow solid that was redissolved in hexanes/benzene and filtered through alumina (hexanes/benzene (1:1)). After evaporating the solvent, bright yellow crystals were obtained. (1.878 g, 75%). $^1$H NMR (CDCl$_3$) δ: 7.61 (d, J=7.3 Hz, 4H), 7.49 (d, J=7.3 Hz, 4H), 7.44 (t, J=7.8 Hz, 4H), 7.37 (m, 6H), 2.19 (m, 12H), 1.66 (m, 12H), 1.49 (m, 12H), 0.97 (t, J=7.1 Hz, 18H).

(4-phenylethynyl)trimethylsilylethynylbenzene (9). In a 500-mL Morton round bottom flask, 4-iodo-(trimethylsilylethynyl)benzene, 8, (2.19 g, 7.29 mmol) was added, followed by CuI (0.13 g, 0.67 mmol), dichlorobis(triphenylphosphine) palladium (II) (0.089 g, 0.13 mmol.) and 100 mL of triethylamine. The reaction was stirred under N$_2$, while the temperature was increased to reflux. A solution of phenylacetylene, 7, in triethylamine (10 mL) was added dropwise and the solution changed from a translucent, transparent yellow to a dark green. After 3 days, the reaction mixture was cooled to ambient temperature and a mixture of dichloromethane and hexanes was added to the reaction flask. The mixture was filtered through CELITE™, then washed with saturated NH$_4$Cl. The aqueous layer was extracted with dichloromethane and the organic layers combined, dried over MgSO$_4$ and concentrated in vacuo. The crude product was purified by column chromatography (SiO$_2$/hexanes) giving a golden yellow powder. (1.915 g, 95%). $^1$H NMR (CDCl$_3$) δ: 7.56 (m, 2H), 7.48 (m, 4H), 7.37 (m. 3H), 0.28 (s, 9H). (4-phenylethynyl)ethynylbenzene. (4-phenylethynyl)trimethylsilyl-ethynylbenzene (0.999 g, 3.64 mmol) was dissolved in methanol (90 mL) to which 10 mL of 1N aqueous NaOH solution was added and stirred at room temperature.[8] After 45 minutes, the solvent was evaporated, 10 mL of 1N HCl was added and then the mixture was extracted with 60 mL of dichloromethane, washed with water (2×) and dried over MgSO$_4$. The solvent was removed in vacuo, leaving an orange brown solid behind. The crude product was purified by flash chromatography (SiO$_2$/hexanes to give a white solid (0.444 g) in 68% yield. $^1$H NMR (CDCl$_3$) δ: 7.56 (m, 2H), 7.50 (m, 4H), 7.37 (m, 3H), 3.20 (s, 1H).

Bis(1-ethynyl-4-(phenylethynyl)benzene)bis(tri-n-butyl) phosphine)Pt (II). (PE2). 1-ethynyl-4-(phenylethynyl)benzene (1.39 g, 6.9 mmol) and trans-dichlorobis(tri-n-butylphosphine) platinum (II) (2.31 g, 3.45 mmol) were added to a 250 mL, 3-neck round bottom flask followed by CuI (25 mg, 0.13 mmol), and diethylamine (75 mL). The mixture was stirred at ambient temperature overnight under N$_2$ followed by filtration and concentration to give a yellow solid. The solid was recrystallized from EtOAc to give 0.61 g (18%) product isolated as a yellow solid. $^1$H NMR (CDCl$_3$) δ: 7.53 (m, 4H), 7.40 (m, 10H), 7.26 (t, J=8.2 Hz, 4H), 2.15 (m, 12H), 1.64 (m, 12H), 1.49 (m, 12H), 0.95 (t, J=7.3 Hz, 18H). $^{13}$C{$^1$H} NMR (CDCl$_3$): 131.5, 131.2, 130.7, 129.1, 128.3, 123.6, 119.2, 111.8, 109.4, 90.0, 89.8, 26.4, 24.4 (t, J=7.3 Hz), 24.0 (t, J=17.2 Hz) ppm.

1-(trimethylsilylethynyl)-4-(4-fluorophenylethynyl)benzene. 4-iodophenyltrimethylsilylacetylene (2.6 g, 8.7 mmol), 4-fluorophenylacetylene (1.07 g, 8.8 mmol), CuI (18 mg, 0.09 mmol), bis(triphenylphosphine)palladium(II) dichloride (0.18 g, 0.26 mmol), triethylamine (20 mL) and THF (25 mL) were added together and stirred at ambient temperature under N$_2$ for 20 h. The reaction mixture was filtered to remove solids, washed with THF (10 mL), and concentrated to dryness. The crude product was recrystallized from hexanes to give 2.22 g (87%) product. mp 144-146° C. $^1$H NMR (CDCl$_3$) δ: 7.54 (m, 2H), 7.46 (m, 4H), 7.07 (mt, J=8.6 Hz, 2H), 0.28 (s, 9H). $^{13}$C{$^1$H} NMR (CDCl$_3$): 162.6 (J=249.6 Hz), 133.5 (J=8.1 Hz), 131.9, 131.3, 123.1, 123.0, 119.1 (J=3.6 Hz), 115.7 (J=22.0 Hz), 104.6, 96.3, 90.2, 88.7, –0.1 ppm.

1-ethynyl-4-(4-fluorophenylethynyl)benzene. 1-(trimethylsilylethynyl)-4-(4-fluorophenylethynyl)benzene (2.2 g, 7.5 mmol) was dissolved in CH$_2$Cl$_2$ (30 mL) diluted with MeOH (30 mL) and then treated with powdered K$_2$CO$_3$ (2.1 g, 15 mmol) and allowed to stir at ambient temperature for 20 h under N$_2$. The reaction mixture was filtered to remove solids, concentrated, redissolved in CH$_2$Cl$_2$, washed with water (2×), brine, dried over MgSO$_4$, filtered and concentrated to dryness to give 1.43 g (87%) product that was used as is in the next reaction. $^1$H NMR (CDCl$_3$) δ: 7.54 (m, 2H), 7.49 (m, 4H); 7.05 (t, J=8.4 Hz, 2H); 3.20 (s, 1H). $^{13}$C{$^1$H} NMR (CDCl$_3$): 162.6 (J=250.3 Hz), 133.6 (J=8.0 Hz), 132.1, 131.4, 123.6, 122.0, 119.1 (J=3.6 Hz), 115.7 (J=32.0 Hz), 90.3, 88.6, 83.3, 79.0 ppm.

Bis(1-ethynyl-4-(4-fluorophenylethynyl)benzene)bis(tri-n-butyl)phosphine)Pt (II) (F-PE2). 1-ethynyl-4-(4-fluorophenylethynyl)benzene (1.4 g, 6.35 mmol) and trans-dichlorobis(tri-n-butylphosphine) platinum (II) (2.13 g, 3.18 mmol) were added together, followed by CuI (25 mg, 0.13 mmol), and diethylamine (70 mL). The mixture was stirred at ambient temperature for 45 h under N$_2$ during which time a solid formed. followed by filtration and concentration to give a solid. The solid was removed by filtration and the filtrate concentrated, redissolved in CHCl$_3$, washed with water (2×), brine, dried with MgSO$_4$, filtered, concentrated and the solid recrystallized from EtOAc. The original solid was also found to be product. Total yield of product from EtOAc was 1.30 g (79%). mp 149-151° C. $^1$H NMR (CDCl$_3$) δ: 7.51 (m, 4H); 7.39 (m, 4H); 7.25 (d, J=8.1 Hz, 4H); 7.08 (m, 4H); 2.1 (m, 12H); 1.63 (m, 12H); 1.48 (m, 12H), 0.95 (t, J=7.2 Hz, 18H). $^{13}$C{$^1$H} NMR (CDCl$_3$): 162.4 (J=249 Hz), 133.6 (J=8.0 Hz), 131.34, 131.18, 130.95, 130.71, 129.2, 119.4 (J=67 Hz), 115.7 (J=22 Hz), 111.9, 109.3, 89.7, 88.7, 26.7, 24.4 (J=7.6 Hz), 23.96 (J=17.6 Hz), 13.8 ppm.

1-(trimethylsilylethynyl)-4-(4-n-butylphenylethynyl)benzene. 4-iodophenytrimethyl silylacetylene (5.0 g, 16.6 mmol), 4-n-butylphenylacetylene (2.67 g, 16.0 mmol), CuI (32 mg, 0.16 mmol), bis(triphenylphosphine)palladium(II) dichloride (0.35 g, 0.48 mmol), triethylamine (50 mL) and THF (50 mL) were added together and stirred at ambient temperature under N$_2$ for 18 h. The reaction mixture was filtered to remove solids and concentrated to dryness, redissolved in CHCl$_3$, washed with water (2×), brine, dried with MgSO$_4$, filtered, concentrated and the solid recrystallized from hexanes to give 2.10 g (40%) product. The crude product could also be purified by washing with MeOH. This gave 1.94 g additional product for a total yield of 79%. $^1$H NMR (CDCl$_3$) δ: 7.46 (m, 6H), 7.20 (d, J=8.1 Hz, 2H); 2.63 (t, J=7.6 Hz, 2H); 1.62 (m, 2H); 1.38 (m, 2H); 0.95 (t, J=7.2 Hz, 3H); 0.28 (s, 9H). $^{13}$C{$^1$H} NMR (CDCl$_3$): 143.7, 131.9, 131.6, 131.3, 128.5, 123.6, 122.7, 120.1, 104.7, 96.1, 91.6, 88.4, 35.6, 33.4, 22.3, 14.0, –0.1 ppm.

1-ethynyl-4-(4-n-butylphenylethynyl)benzene. 1-(trimethylsilylethynyl)-4-(4-n-butylphenylethynyl)benzene (3.92 g, 11.86 mmol) was dissolved in CH$_2$Cl$_2$ (100 mL) diluted with MeOH (40 mL) and then treated with powdered K$_2$CO$_3$ (2.1 g, 15 mmol) and allowed to stir at ambient temperature for 19 h under N$_2$. The reaction mixture was filtered to remove solids, concentrated, redissolved in CHCl$_3$, washed with water (2×), brine, dried over MgSO$_4$, filtered and concentrated to dryness to give a brown solid. The solid was chromatographed on silica gel, eluting with 15:1 hexanes/EtOAc to give several fractions rich in product. These fractions were combined and chromatographed again with 95:5 hexanes/EtOAc to give 0.25 g (7%) product as a waxy solid. $^1$H NMR (CDCl$_3$) δ: 7.50 (s, 4H), 7.47 (d, J=8.2 Hz, 2H); 7.21 (d, J=8.2 Hz, 2H); 3.20 (s, 1H); 2.63 (t, J=7.8 Hz, 2H); 1.64 (m, 2H); 1.41 (m, 2H); 0.97 (t, J=7.5 Hz, 3H). $^{13}$C{$^1$H} NMR (CDCl$_3$): 143.8, 132.1, 11.6, 131.4, 128.6, 124.1, 121.6, 120.0, 91.7, 88.2, 83.4, 78.8, 35.6, 33.4, 22.2, 14.0 ppm.

Bis(1-ethynyl-4-(4-n-butylphenylethynyl)benzene)bis(tri-n-butyl)phosphine)Pt (II) (n-Bu-PE2). 1-ethynyl-4-(4-n-butylphenylethynyl)benzene (0.24 g, 0.81 mmol) and trans-dichlorobis(tri-n-butylphosphine) platinum (II) (0.27 g, 0.41 mmol) were added together, followed by CuI (10 mg), and diethylamine (20 mL). The mixture was stirred at ambient temperature for 70 h under nitrogen. The reaction was concentrated and azeotroped twice with methanol. The residue was dissolved in 2:1 Hexane/CH$_2$Cl$_2$ and washed 3 times with water. The final water wash was neutral pH. The solution was concentrated and the product recrystallized from EtOAc/MeOH. The solvent was removed and the crystals were washed 3 times with 2:1 MeOH/EtOAc. After drying, 164 mg (35%) of a light brown product was obtained. $^1$H NMR (CDCl$_3$) δ: 7.44 (d, 4H); 7.38 (d, 4H); 7.24 (d, 4H); 7.17 (d, 4H); 2.64 (3,4H); 2.14 (m, 12H); 1.62 (m, 16H); 1.55-1.35 (16H); 0.96 (m, 24H).

1-(trimethylsilylethynyl)-4-(p-methoxyphenylethynyl)benzene. Into a 50 ml round bottom flask was placed a mixture of 0.72 g (0.0054 mole) of p-methoxyphenylacetylene, 1.51 g (0.005 mole) of 4-iodophenyltrimethylsilylacetylene, 0.0102 g (0.0053 mmole) of CuI, 0.102 g (0.146 mmole) of bis(triphenylphosphine)palladium(II) dichloride in 10 ml of THF and 10 ml of triethylamine. The light orange brown mixture was stirred at room temperature under nitrogen for 3 days. The reaction mixture was then filtered and the filtrate concentrated under reduced pressure. The residue was redissolved in 10 ml of chloroform and the solution was washed two times with water (10 ml each) and then dried over anhydrous MgSO$_4$, filtered and concentrated. 1.5 g (98.7% yield) of solid was obtained. $^1$HNMR: 0.28 ppm (s, 9H); 3.85 ppm (s, 3H); 6.90 ppm (d, 2H); 7.45 ppm (s, 4H); 7.48 ppm (d, 2H).

1-ethynyl-4-(p-methoxyphenylethynyl)benzene. Into a 100 ml round bottom flask was placed a mixture of 1.5 g (0.0049 mole) of 1-(trimethylsilylethynyl)-4-(p-methoxyphenylethynyl)benzene, 1.36 g (0.0098 mole) potassium carbonate, 20 ml of methanol and 20 ml of methylene chloride. The mixture was stirred at room temperature under nitrogen overnight. The dark brown suspension was filtered and the methylene chloride solution was washed twice with water (20 ml each). The aqueous layers were combined and extracted twice with methylene chloride (10 ml each). The organic layers were combined and dried over anhydrous MgSO$_4$, filtered and concentrated. 0.62 g (54.9% yield) of solid was obtained. $^1$HNMR showed the desired product being the major component. This crude solid was carried on to the next step without purification.

Bis(1-ethynyl-4(p-methoxyphenylethynyl)benzene)bis(tri-nbutylphosphine)Pt(II) (MeO-PE2). Into a 100 ml flask was charged with a mixture of 0.62 g (0.0027 mole) of 1-ethynyl-4-(p-methoxylphenylethynyl)benzene, 0.89 (0.00134 mole) of trans-dichloro-bis(tri-n-butylphosphine) platinum (II), 0.012 g (0.063 mmole) of CuI in 30 ml of diethylamine. The mixture was stirred overnight at room temp. The reaction mixture was filtered and the solid washed with methylene chloride. The filtrate was concentrated. A reddish brown oil was obtained. The crude product was purified by silica gel column chromatography. 0.49 g of pure component was obtained. Both $^1$HNMR and MS indicated that the component was actually the chloro-(1-ethynyl-4(p-methoxyphenylethynyl)benzene)bis(tri-n-butylphosphine)Pt(II). The reaction did not proceed to completion.

1-(trimethylsilylethynyl)-4-(4-methylphenylethynyl)benzene. Into a 50 ml round bottom flask was placed a mixture of 0.64 g (0.0054 mole) of 4-methylphenylacetylene, 1.50 g (0.005 mole) of 4-iodophenyltrimethylsilylacetylene, 0.011 g (0.0058 mmole) of CuI, 0.103 g (0.146 mmole) of bis(triphenylphosphine)palladium(II) dichloride in 10 ml of THF and 10 ml of triethylamine. The brown solution turned to an orange-yellow suspension when solid started to form. The mixture was stirred at room temperature under nitrogen for 3 days. It was filtered and the filtrate concentrated under reduced pressure. The residue was redissolved in 25 ml of chloroform and the solution was washed two times with water (15 ml each) and then dried over anhydrous MgSO$_4$, filtered and concentrated. 1.43 g (quantitative yield) of solid was obtained. $^1$HNMR indicated ~10% of by product present. The solid product was used for the next step without further purification.

1-ethynyl-4-(4-methylphenylethynyl)benzene. Into a 100 ml round bottom flask was placed a mixture of 1.43 g (0.005 mole) of 1-(trimethylsilylethynyl)-4-(4-methylphenylethynyl)benzene, 1.37 g (0.01 mole) potassium carbonate, 20 ml of methanol and 20 ml of methylene chloride. The mixture was stirred at room temperature under nitrogen overnight. The dark brown suspension was filtered and the filtrate was washed twice with water (20 ml each). The aqueous layers were combined and extracted twice with methylene chloride (10 ml each). The methylene chloride layers were combined and dried over anhydrous MgSO$_4$, filtered and concentrated. 0.7 g (73.1% yield) of brownish yellow solid was obtained. $^1$HNMR: 2.40 ppm (2,3H); 3.19 ppm (s, 1H); 7.15-7.18 ppm (d, 2H); 7.43-7.46 ppm (d, 2H); 7.49 (s, 4H). The NMR indicated that there were some by-products present. It was used for the next step without further purification.

Bis(1-ethynyl-4(4-methylphenylethynyl)benzene)bis(tri-n-butylphosphine)Pt(II) (Me-PE2). Into a 100 ml flask was charged with a mixture of 0.72 g (0.0033 mole) of 1-ethynyl-4-(4-methylphenylethynyl)benzene, 1.12 g (0.0017 mole) of trans-dichloro-bis(tri-n-butylphosphine) platinate(II), 0.014 g (0.074 mmole) of CuI in 45 ml of diethylamine. The muddy brown suspension was stirred overnight at room temp. The reaction mixture (dark yellow suspension) was filtered and the solid washed with methylene chloride. The filtrate was concentrated. 1.0 g of gummy reddish brown residue was obtained. The crude product was purified by recrystallization from ethyl acetate (10 ml). 0.21 g (12.3% yield) of yellow crystal was obtained. 1.9 ppm (m, 18H); 1.4-1.6 ppm (m, 24H); 2.0-2.2 ppm (m, 12H); 2.40 ppm (*s, 6H); 7.14-7.44 ppm (aromatic, 16H); m.p. 144-148C.

1-(trimethylsilylethynyl)-4-(3,5-dimethoxyphenylethynyl)benzene. Into a 100 ml round bottom flask was placed a mixture of 1.31 g (0.0081 mole) of 3.5-dimethoxyphenylacetylene, 2.25 g (0.0075 mole) of 4-iodophenyl-trimethylsilylacetylene, 0.016 g (0.084 mmole) of CuI, 0.155 g (0.22 mmole) of bis(triphenylphosphine)palladium(II) dichloride in 15 ml of THF and 15 ml of triethylamine. The light brown solution turned to a suspension within a minute. After ~40 min, the reaction mixture turned to an orange solution with some white ppt. The reaction was followed by TLC. The mixture was stirred at room temperature under nitrogen overnight. TLC showed presence of staring material still. The reaction was stirred continuously overnight at room temp. Not much further reaction had occurred. It was then stirred overnight at 50° C. TLC indicated that only a trace of starting material was present. The reaction was then terminated and the reaction mixture was filtered and the filtrate concentrated under reduced pressure. The residue was redissolved in 15 ml of chloroform and the solution was washed two times with water (15 ml each) and dried over anhydrous MgSO$_4$, filtered and concentrated. 2.27 g (90.4% yield) of solid was obtained. $^{1H}$NMR: 0.26 ppm (s, 9H); 3.83 ppm (s, 6H); 6.49 ppm (s, 1H); 6.70 ppm (s, 2H); 7.47 ppm (s, 4H).

1-ethynyl-4-(3,5-dimethyoxyphenylethynyl)benzene. Into a 100 ml round bottom flask was placed a mixture of 2.27 g (0.0068 mole) of 1-(trimethylsilylethynyl)-4-(3,5-dimethoxyphenylethynyl)benzene, 1.88 g (0.0136 mole) potassium carbonate, 30 ml of methanol and 30 ml of methylene chloride. The mixture was stirred at room temperature overnight under nitrogen. The dark brown suspension was filtered through an alumina bed to remove some color, and the still dark color filtrate was washed twice with water (30 ml each). The aqueous layers were combined and extracted twice with methylene chloride (20 ml each). The methylene chloride layers were combined and dried over anhydrous MgSO$_4$, filtered and concentrated. 1.13 g of brown oil was obtained. The crude oil was purified by Preparative LC using 1:10 EtOAc:hexane as eluting solvent. 240 mg (13.5% yield) of yellow solid was obtained. $^1$HNMR: 3.20 ppm (s, 1H); 3.83 ppm (s, 6H); 6.50 ppm (t, 1H); 6.71 ppm (d, 2H); 7.50 ppm (s, 4H).

Bis(1-ethynyl-4(3,5-dimethoxyphenylethynyl)benzene)bis(tri-n butylphosphine)Pt(II) (3,5-diMeO-PE2). Into a 25 ml flask was charged with a mixture of 119.5 mg (0.456 mmole) of 1-ethynyl-4-(3,5-dimethoxyphenylethynyl)benzene, 0.152 g (0.228 mmole) of trans-dichloro-bis(tri-n-butylphosphine) platinate(II), 0.003 g (0.0157 mmole) of CuI in 7 ml of diethylamine. The reaction mixture was stirred at room temp and turned to a slightly greenish yellow cloudy mixture. Reaction was continued overnight at room temperature. NMR indicated the reaction was not completed. It was continuously stirred at room temperature for another 24 hours and NMR indicated the reaction didn't proceed any further. The reaction was then terminated. The reaction mixture was filtered and the solid washed with methylene chloride. The filtrate was concentrated. 240 mg of brown color semi-solid was obtained. The crude product was purified by Preparative LC using 1:4 EtOAc:hexanes as eluting solvent. and obtained 61 mg of pure white solid. $^1$HNMR: 0.95 ppm (t, 18H); 1.46-1.62 ppm (m, 24H); 2.14 ppm (m, 12H); 3.83 ppm (s, 12H); 6.47 ppm (t, 2H); 6.69 ppm (d, 4H); 7.23 ppm (d, 4H); 7.38 ppm (d, 4H).

1-(trimethylsilylethynyl)-4-(4-N,N-dimethylaminophenylethynyl)benzene. Into a 100 ml round bottom flask was placed a mixture of 1.17 g (0.0081 mole) of 4-N,N-dimethylaminophenylacetylene, 2.25 g (0.0075 mole) of 4-iodophenyl-trimethylsilylacetylene, 0.015 g (0.075 mmole) of CuI, 0.155 g (0.219 mmole) of bis(triphenylphosphine)-palladium (II) dichloride in 15 ml of THF and 15 ml of triethylamine. The light brown suspension was stirred overnight at room temperature. TLC indicated the presence of starting material. The reaction was continued for another 24 hours at room temperature and no further reaction was observed. It was then stirred at 50° C. overnight. TLC indicated that only a trace amount of starting material was present. The reaction was terminated and the reaction mixture was filtered. The filtrate was concentrated under reduced pressure. The residue was redissolved in 15 ml of chloroform and the solution was washed two times with water (15 ml each) and then dried over anhydrous MgSO$_4$, filtered and concentrated. 2.26 g (94.9% yield) of solid was obtained. $^1$HNMR: 0.28 ppm (s, 9H); 3.02 ppm (s, 6H); 6.69 ppm (d, 2H); 7.41 ppm (d, 2H); 7.44 ppm (s, 4H).

1-ethynyl-4-(4-N,N-dimethylaminophenylethynyl)benzene. Into a 100 ml round bottom flask was placed a mixture of 2.26 g (0.0071 mole) of 1-(trimethylsilylethynyl)-4-(4-N,N-dimethylaminophenylethynyl)benzene, 1.97 g (0.0143 mole) potassium carbonate, 30 ml of methanol and 30 ml of methylene chloride. The mixture was stirred at room temperature overnight under nitrogen. The dark brown suspension was filtered and the filtrate was washed twice with water (30 ml each). The aqueous layers were combined and extracted twice with methylene chloride (20 ml each). The methylene chloride layers were combined and dried over anhydrous MgSO$_4$, filtered and concentrated. 1.0 g of brownish yellow solid was obtained. The crude product was purified by Preparative LC. 280 mg of purified product was collected. It was further purified by recrystallization from EtOAc/hexanes yielding 112 mg (5.4% yield) of pure product. $^1$HNMR: 3.02 ppm (s, 6H); 3.17 ppm (s, 1H); 6.69 ppm (d, 2H); 7.41 ppm (d, 2H); 7.46 ppm (s, 4H).

Bis(1-ethynyl-4(4-N,N-dimethylaminophenylethynyl)benzene)bis(tri-n-butyl-phosphine)Pt(II) (DMA-PE2). Into a 25 ml flask was charged with a mixture of 112 mg (0.457 mmole) of 1-ethynyl-4-(4-N,N-dimethylaminophenylethynyl)benzene, 0.152 g (0.227 mmole) of trans-dichloro-bis(tri-n-butylphosphine) platinate(II), 0.003 g (0.0157 mmole) of CuI in 7 ml of diethylamine. The yellow suspension was stirred overnight at room temperature. The reaction mixture was filtered and the filtrate was concentrated. 164 mg of dark yellow semi-solid was obtained. The crude product was purified by Preparative LC. 84 mg (33.7%) of pure product was obtained. $^1$HNMR: 0.96 ppm (t, 18H); 1.47 ppm (m, 24H); 2.03 ppm (m, 12H); 3.00 ppm (s, 12H); 6.68 ppm (d, 4H); 7.36 ppm (d, 8H); 7.40 ppm (d, 4H).

EXAMPLE 2

Linear Optical Measurements

As mentioned above, minimal absorption at 405 nm is required for blue RSA dyes. UV-Vis spectra were taken of the platinum-ethynyl complexes prepared according to Example 1, and the absorptions were normalized by converting them to extinction coefficient as a function of the wavelength. The data from this example are summarized in Table 1.

TABLE 1

| Pt-Complexes | $\lambda_{max}$/nm[b] | $\epsilon_{max}$/M$^{-1}$cm$^{-1}$[b] | $\epsilon_{405nm}$/M$^{-1}$cm$^{-1}$[c] |
|---|---|---|---|
| PE2 | 356 | 87561 | 51 |
| PPE | 331 | 75939 | 111 |

All measurements were conducted in benzene. [b]$\lambda_{max}$ and $\epsilon_{max}$ were measured in benzene for PPE and in chloroform for PE2. [c]The extinction coefficient at 405 nm was calculated using concentrated solutions (~10$^{-2}$-10$^{-3}$M).

EXAMPLE 3

Non-Linear Optical Measurements

Nonlinear optical absorption experiments were employed to determine the non-linearity of the Pt-complexes. The measurements were done using a 5 ns pulsed tunable laser system operating at the 405 nm wavelength. Z-scan is one of the common nonlinear-optical techniques to asses non-linearity in material absorbance and has been documented in the literature (e.g. "Nonlinear Optics of Organic Molecules and Polymers", Edited by H. S. Nalwa and S. Miyata, CRC Press 1997). Briefly, Z-scan is a technique in which the sample is moved through a focused laser beam, causing the light intensity on sample to change, and changes in the sample's transmissivity are measured as a function of position. Alternatively, a sample may be subjected to a focused pulsed laser beam of variable power, and the transmissivity at the laser wavelength may be directly measured as a function of the light intensity (optical flux) of the incident radiation. Both approaches result in a dependence of the dye's transmissivity upon the incident light intensity, which constitutes its nonlinear optical response.

These dependencies are then analyzed to obtain two parameters that characterize the behavior of the platinum ethynyl complex: the threshold intensity ($I_{th}$)—the energy flux at which the nonlinear response "turns on", and the "k value"—the enhancement factor that describes the achievable ratio between the high- and low-intensity absorption cross-sections. These parameters define the range of optical power that can utilize the dye properties, and how efficient the reverse saturable absorption process is. The goal is to minimize the threshold value and maximize the k value.

The dye concentrations were chosen to achieve transmissivity around 0.8-0.9. Dichlorobenzene was used as a solvent and after mixing with the platinum ethynyl complexes, the solutions were filtered and placed in 1 mm cuvettes for Z-scan measurements.

Figure 6A:
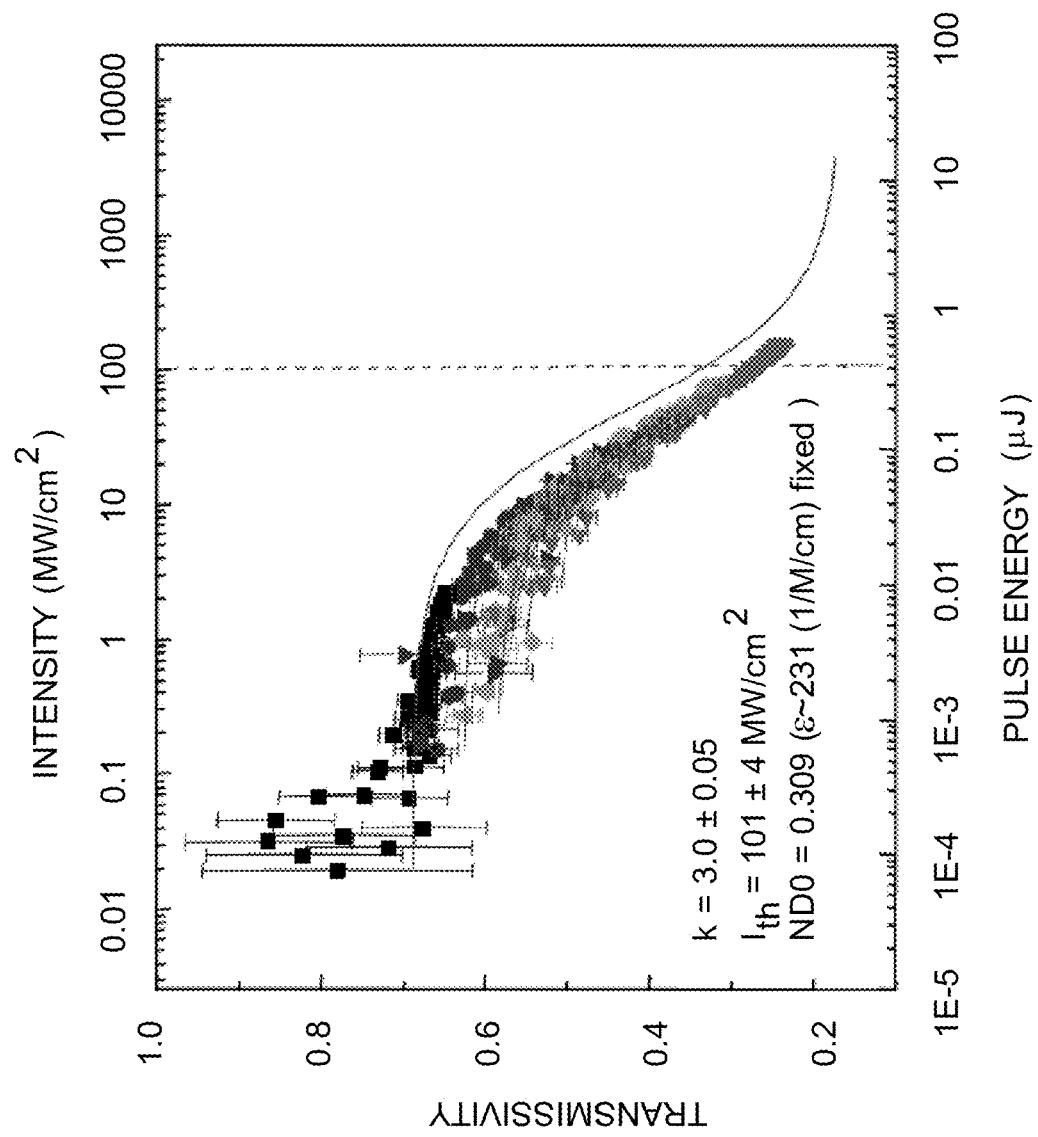
FIG. 6A is a graphical depiction of the Z-Scan measurements taken of a platinum-ethynyl complex (PE2) useful in the present media and methods.
Figure 6B:
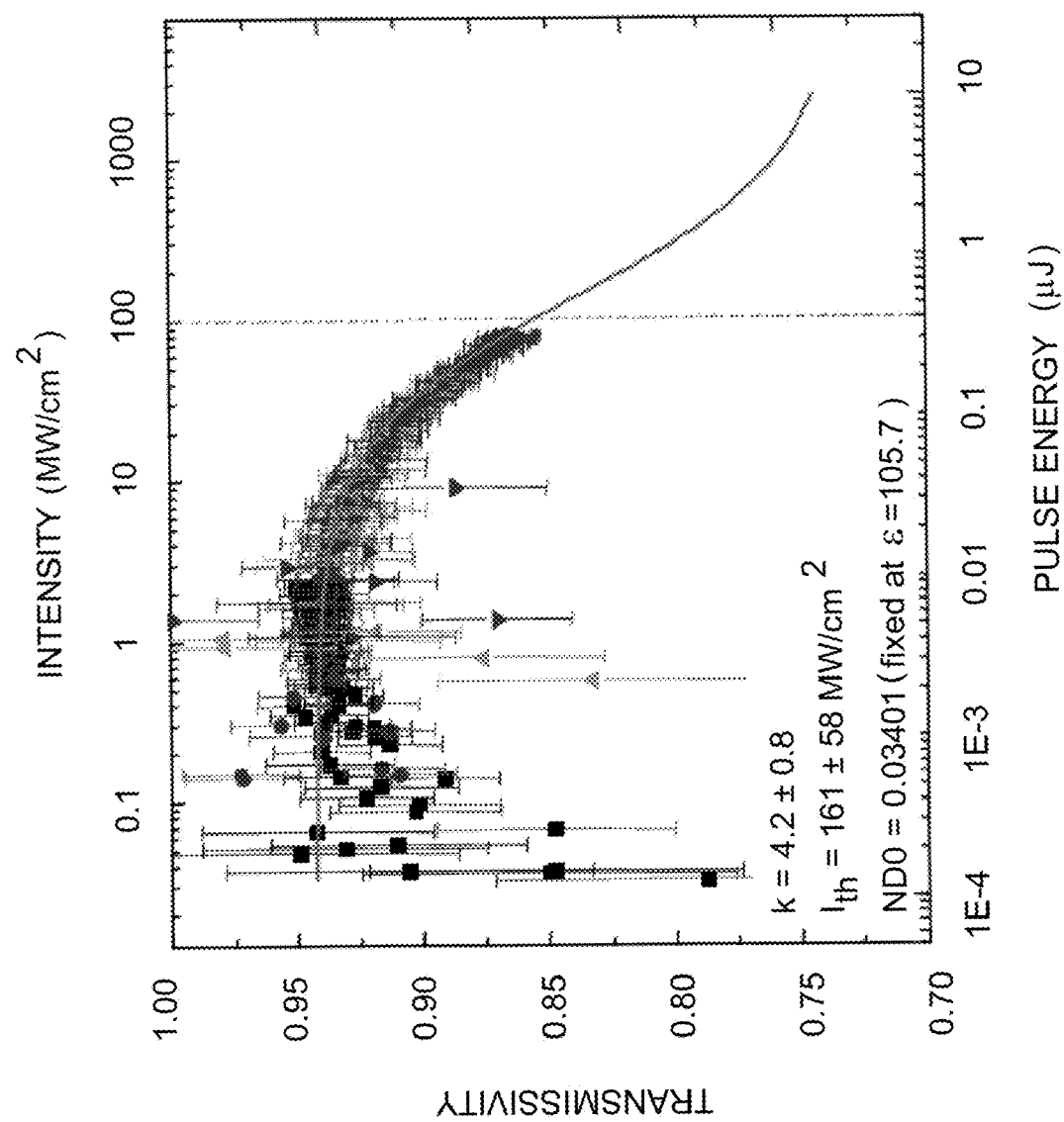
FIG. 6B is a graphical depiction of the Z-Scan measurements taken of a platinum-ethynyl complex (PPE) useful in the present media and methods.

FIGS. 6A-6B show the normalized transmission vs pulse energy data for PE2 (6A) and PPE (6B) dyes at varying laser intensities. These data were obtained from the dependence of normalized transmission against Z-position. As can be seen in these graphs, at low pulse energies very low levels of the beam are absorbed and most of the light is transmitted through the sample. However, as the pulse energies increases, more and more of the light is absorbed and so the amount of light transmitted is less, demonstrating the nonlinear effect of the dye. Compounds that don't display RSA behavior would not display the drop in transmitted light at higher pulse energies. The multiple lines within each plot represent multiple experiments on the same individual compounds. Table 2 summarizes the data obtained from the Z-scan measurements.

TABLE 2

| | Extinction Coeff (@405 nm) 1/M/cm | $I_{th}$ | +/−dI | k | +/−dk |
|---|---|---|---|---|---|
| PE2 | 231.1 | 101 | 4 | 3 | 0.05 |
| PPE | 105.7 | 161 | 58 | 4.2 | 0.8 |

As shown in Table 2, PE2 and PPE showed non-linear properties with low k values. This meant that these dyes have a low enhancement of absorption cross-section. However the threshold intensity, above which the higher $T_n$ triplet states start to be excited, show reasonable energies of ~100 MW/cm$^2$, which are acceptable.

Example 3 shows that the platinum-ethynyl complexes studied exhibit sufficient non-linear optical properties to be considered as a key components for a u-hologram recording medium.

EXAMPLES 4-6

Microhologram Recording

Sample Preparation
Thin film samples for demonstrating microholograms and recording the reflectivity after writing microholograms were prepared as follows:

EXAMPLE 4

Platinum Ethynyl/Stilbene/PMMA. Solution of PMMA (0.870 g) with trans-stilbene (80 mg), and 0.5 wt % of PPE (trans-Bis(tributylphosphine)bis(4-ethynylbiphenyl)platinum) will be prepared using dichloroethane/methylene chloride solvent mixture (15 g, 2:8 v/v) as solvent. The solution will be filtered using 0.45 μm filter, poured onto a glass rim (5 cm diameter) on a glass plate setup and dried on a hot plate maintained at about 45° C. for 5 hours and at about 75° C. overnight. After drying on a hot plate, the films will be removed from the glass plates and vacuum dried at 60° C. for 6 hours.

EXAMPLE 5

Platinum Ethynyl/polyvinylcinnamate (PVCm). 1 g of PVCm containing 68 wt % cinnamate (MW 100,000) was dissolved in 1:1 dichloroethane/methylene chloride. 0.5 wt % of PPE (trans-Bis(tributylphosphine)bis(4-ethynylbiphenyl) platinum) was added and the materials dissolved by stirrer accompanied by heating on a hot plate maintained at 70° C. The solution was then filtered using a 0.450 mm syringe filter and the filtered solution poured into a glass rim (5 cm diameter) on a glass plate setup and dried on a hot plate maintained at 45° C. for 12 hours and at 75° C. overnight. After drying on a hot plate, the films were removed from the glass plates and dried in vacuum at 70° C. for 6 hours.

EXAMPLE 6

Platinum Ethynyl/polyvinylcinnamate (PVCm). 1 g of PVCm containing 68 wt % cinnamate (MW 100,000) was dissolved in 1:1 dichloroethane/methylene chloride. 1.5 wt % of PE2 (trans-Bis(tributylphosphine)bis(4-ethynyl-1-(2-phenylethynyl)benzene)platinum) was added and the materials dissolved by stirrer accompanied by heating on a hot plate maintained at 70° C. The solution was then filtered using a 0.450 mm syringe filter and the filtered solution poured into a glass rim (5 cm diameter) on a glass plate setup and dried on a hot plate maintained at 45° C. for 12 hours and at 75° C. overnight. After drying on a hot plate, the films were removed from the glass plates and dried in vacuum at 70° C. for 6 hours.

Microhologram Recording
A tunable optical parametric oscillator system operating at the 405 nm wavelength was used as a pulsed light source for recording and readout of micro-holograms. The light was focused into the medium sample using optics with numerical aperture (NA) of 0.16, resulting in the approximate dimensions of the recording volume to be 1.6×1.6×17 μm. The pulse energies used for micro-hologram recording was between 10 s to 100 s of nano-Joules, which allowed one to achieve light intensity values of hundreds of MW/cm$^2$ to several GW/cm$^2$ at the focal spot of such focused recording beam. The readout of the light reflected from micro-holograms was done using the same beam attenuated by approximately 100-1000× with respect to the recording power.

The recording of μ-holograms in the optical data storage media was performed by two high-intensity counter-propagating pulsed recording beams focused and overlapped in the bulk of the recording medium to produce the intensity fringe pattern consisting of light and dark regions (fringes). The illuminated regions of the interference pattern undergo a change as described above, which results in a locally modified refractive index of the material, while the dark regions remain intact, thus creating a volume hologram. The present threshold optical data storage media is sensitive to a high-intensity light and is relatively inert to the low-intensity radiation. The power of the recording beam was adjusted so that the light intensity near the focal region of the beam is above the recording threshold (above which the change readily occurs), while remaining low outside the recordable region away from the focal spot of the beam, thus eliminating unintended media modification (recording or erasure).

During μ-hologram recording, the primary recording beam was split into the signal and the reference using a half-wave plate (λ/2) and a first polarization beam splitter. The two secondary beams were steered to the sample in a counter-propagating geometry and are focused to overlap in the bulk of the optical data storage media by identical aspheric lenses with a numerical aperture (NA) of up to 0.4. The polarization of both beams was converted into circular polarization—with two quarter-wave plates (λ/4) to ensure that the beams interfere to create a high-contrast fringe pattern. The sample and the signal beam lens were mounted on closed-loop three-axis positioning stages with 25 nm resolution. A position-sensitive detector on the reference side of the sample was used to align the signal lens for optimized overlap of the focused signal and reference beams in the medium, and thus, optimized recording.

A variable attenuator and the half-wave plate/PBS assembly were used to control the power level during recording and/or read-out. This allows the μ-holographic recording characteristics of the optical data storage media to be measured as a function of the recording power and/or energy. This functional dependence distinguishes between a linear optical data storage medium/recording, where the strength of the recorded hologram is largely defined by the total amount of light energy received by the medium, but is independent of the light intensity, and a nonlinear, threshold optical data storage medium/recording, where the recording efficiency is highly dependent upon the intensity of the light. In a linear medium, a small exposure results in a low-strength hologram, which gradually grows with higher exposures. In contrast, in a non-linear, threshold medium, recording is only possible with intensity exceeding the threshold value.

During read-out, the signal beam was blocked, and the reference beam was reflected by the μ-holograms in the direction opposite to the incident direction. The reflected beam was coupled out from the incident beam path using the quarter-wave plate and a second polarizing beam splitter, and was collected on a calibrated photodiode in a confocal geometry to provide an absolute measure of the diffraction efficiency. By translating the sample with respect to the readout optics, it was possible to obtain a 3D profile of a micro-hologram diffraction response and evaluate dimensions of a micro-hologram.

The diffraction efficiency for Example 4 is expected to be from about 0.03% to about 0.26%, depending on the recording fluence. The diffraction efficiency for Example 5 was 0.43%; and the diffraction efficiency for Example 6 was 0.031%.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A method, comprising:
   (a) providing an optical data storage medium comprising:
      a polymer matrix;
      a reactant capable of undergoing a photochemical change upon triplet excitation to form a product, thereby causing a refractive index change in the medium; and
      a non-linear sensitizer comprising one or more platinum ethynyl complexes capable of absorbing actinic radiation at 405 nm to cause upper triplet energy transfer to said reactant; and
   (b) recording a hologram in said optical data storage medium by irradiating the optical data storage medium with an actinic radiation having a wavelength of about 405 nm and an intensity greater than a threshold value.

2. The method of claim 1, wherein the one or more trans-platinum ethynyl complexes comprise Bis(tributylphosphine)bis(4-ethynylbiphenyl)platinum (PPE), Bis(tributylphosphine)bis(4-ethynyl-1-(2-phenylethynyl)benzene) platinum (PE2), Bis(1-ethynyl-4-(4-n-butylphenylethynyl)benzene)bis(tri-n-butyl)phosphine)Pt (II), (n-Bu-PE2), Bis(1-ethynyl -4-(4-fluorophenylethynyl)benzene)bis(tri-n-butyl)phosphine)Pt(II)(F-PE2), Bis(1-ethynyl-4-(4-methoxyphenylethynyl)benzene)bis(tri-n-butyl)phosphine) Pt(II) (MeO-PE2), Bis(1-ethynyl-4-(4-methylphenylethynyl)benzene)bis(tri-n-butyl)phosphine)Pt (II) (Me-PE2), Bis(1-ethynyl-4(3,5-dimethoxyphenylethynyl)benzene)bis(tri-nbutylphosphine)Pt(II) (3,5-diMeO-PE2), Bis(1-ethynyl-4(4-N,N-dimethylaminophenylethynyl) benzene)bis(tri-n-butyl-phosphine)Pt(II) (DMA-PE2), or combinations of these.

3. The method of claim 2, wherein the one or more platinum ethynyl complexes comprise PPE and PE2 or combinations of these.

4. The method of claim 1, further comprising a mediator capable of transferring energy between the non-linear sensitizer and the reactant.

5. The method of claim 4, wherein the mediator comprises acetophenone, dimethylphthalate, benzophenone, 9H-fluorene, biphenyl, phenanthrene, 1-napthonitrile, and combinations of these.

6. A method, comprising:
   (a) providing an optical data storage medium comprising:
      a polymer matrix;
      a reactant capable of undergoing a photochemical change upon triplet excitation to form a product, thereby causing a refractive index change in the medium, wherein the reactant comprises stilbenes, cinnamates, cinnamides, or a combination of these; and
      a non-linear sensitizer comprising one or more platinum ethynyl complexes capable of absorbing actinic radiation at 405 nm to cause upper triplet energy transfer to said reactant; and
   (b) recording a hologram in said optical data storage medium by irradiating the optical data storage medium with an actinic radiation having a wavelength of about 405 nm and an intensity greater than a threshold value.

7. The method of claim 6, wherein the one or more trans-platinum ethynyl complexes comprise Bis(tributylphosphine)bis(4-ethynylbiphenyl)platinum (PPE), Bis(tributylphosphine)bis(4-ethynyl-1-(2-phenylethynyl)benzene) platinum (PE2)Bis(1-ethynyl-4-(4-n -butylphenylethynyl)benzene)bis(tri-n-butyl)phosphine)Pt (II), (n-Bu-PE2), Bis(1-ethynyl -4-(4-fluorophenylethynyl)benzene)bis(tri-n-butyl)phosphine)Pt(II)(F-PE2), Bis(1-ethynyl -4-(4-methoxyphenylethynyl)benzene)bis(tri-n-butyl)phosphine) Pt(II) (MeO-PE2), Bis(1-ethynyl-4-(4-methylphenylethynyl)benzene)bis(tri-n-butyl)phosphine)Pt (II) (Me-PE2), Bis(1-ethynyl-4(3,5-dimethoxyphenylethynyl)benzene)bis(tri-nbutylphosphine)Pt(II) (3,5-diMeO-PE2), Bis(1-ethynyl-4(4-N,N-dimethylaminophenylethynyl) benzene)bis(tri-n-butyl -phosphine)Pt(II) (DMA-PE2), or combinations of these.

8. The method of claim 7, wherein the one or more platinum ethynyl complexes comprise, PPE and PE2 or combinations of these.

9. The method of claim 6, wherein the reactant comprises a trans-stilbene, trans-methoxystilbene or combinations of these.

10. The method of claim 6, wherein the reactant comprises polyvinylcinnamate (PVCm), polyvinyl 4-chlorocinnamate (PVClCm), polyvinyl 4-methoxycinnamate (PVMeOCm), (2E,2'E)-((1S,2S)-cyclohexane-1,2-diyl)bis(3-phenylacrylate), (2E,2'E)-(1S,2S)-cyclohexane-1,2-diyl)bis(4-chlorophenylacrylate), (2E,2'E)-(1S,2S)-cyclohexane-1,2-diyl) bis(4-methoxyphenyl)acrylate), (2E,2'E)-N,N'-((1S,2S)-cyclohexane-1,2-diyl)bis(3-phenyl)acrylamide(2E,2'E)-N, N'-((1S,2S)-cyclohexane-1,2-diyl)bis(3-(4-chlorophenyl) acrylamide), (2E,2'E)-N,N'-((1S,2S) -cyclohexane-1,2-diaryl)bis(3-(4-methoxyphenyl)acrylamide, or combinations of these.

11. The method of claim 6, wherein the medium is capable of storing microholographic data.

12. The method of claim 6, wherein the polymer matrix comprises one or more poly(alkyl methacrylates), poly(alkyl acrylates), polystyrenes, polycarbonates, poly acrylates, poly (vinylidene chloride), poly(vinyl acetate), or combinations thereof.

13. The method of claim 6, wherein the reactant and non-linear sensitizer are distributed substantially homogenously throughout the polymer matrix.

* * * * *